(12) United States Patent
Geha et al.

(10) Patent No.: US 7,205,164 B1
(45) Date of Patent: Apr. 17, 2007

(54) METHODS FOR FABRICATING MAGNETIC CELL JUNCTIONS AND A STRUCTURE RESULTING AND/OR USED FOR SUCH METHODS

(75) Inventors: Sam Geha, Cupertino, CA (US); Benjamin C. E. Schwarz, San Jose, CA (US); Chang Ju Choi, Fremont, CA (US); Biju Parameshwaran, Union City, CA (US); Eugene Y. Chen, Fremont, CA (US); Helen L. Chung, San Jose, CA (US); Kamel Ounadjela, Belmont, CA (US); Witold Kula, Cupertino, CA (US)

(73) Assignee: Silicon Magnetic Systems, San Jose, CA (US)

( * ) Notice: Subject to any disclaimer, the term of this patent is extended or adjusted under 35 U.S.C. 154(b) by 0 days.

(21) Appl. No.: 11/039,301

(22) Filed: Jan. 19, 2005

(51) Int. Cl.
*H01L 21/00* (2006.01)
(52) U.S. Cl. .................... 438/3; 438/240; 257/E21.665
(58) Field of Classification Search .................... 438/3, 438/240, 717–751
See application file for complete search history.

(56) References Cited

U.S. PATENT DOCUMENTS

| 5,660,682 | A | 8/1997 | Zhao et al. |
| 6,165,803 | A | 12/2000 | Chen et al. |
| 6,204,192 | B1 | 3/2001 | Zhao et al. |
| 6,759,263 | B2 | 7/2004 | Ying et al. |
| 6,933,239 | B2 | 8/2005 | Ying et al. |
| 2003/0045131 | A1 | 3/2003 | Verbeke et al. |
| 2004/0084400 | A1* | 5/2004 | Costrini et al. ............... 216/22 |

FOREIGN PATENT DOCUMENTS

EP   1251570   10/2002

OTHER PUBLICATIONS

U.S. Appl. No. 10/979,072, filed Oct. 29, 2004.

* cited by examiner

*Primary Examiner*—H. Jey Tsai
(74) *Attorney, Agent, or Firm*—Kevin L. Daffer; Mollie E. Lettang; Daffer McDaniel, LLP

(57) ABSTRACT

Methods for patterning a magnetic cell junction and a topography used for and/or resulting from such methods are provided. In particular, a method is provided which includes etching portions of a topography adjacent to a patterned photoresist layer to a level within a cap film of the topography, removing etch residues from the topography and subsequently etching the remaining portions of the cap film to expose an uppermost magnetic layer. Another method is provided which includes patterning a dielectric mask layer above a patterned upper portion of a magnetic cell junction and ion milling a lower portion of the magnetic cell junction in alignment with the mask layer. An exemplary topography which may result and/or may be used for such methods includes a stack of layers having a dual layer cap film arranged above at least two magnetic layers spaced apart by a tunneling layer.

18 Claims, 7 Drawing Sheets

METHODS FOR FABRICATING MAGNETIC CELL JUNCTIONS AND A STRUCTURE RESULTING AND/OR USED FOR SUCH METHODS

BACKGROUND OF THE INVENTION

1. Field of the Invention

This invention relates to the formation of microelectronic devices including magnetic elements, and more particularly, to methods for patterning a magnetic cell junction and a structure used for and resulting from such methods.

2. Description of the Related Art

The following descriptions and examples are given as background only.

Recently, advancements in the use of magnetoresistive materials have progressed the development of magnetic random access memory (MRAM) devices to function as viable non-volatile memory circuits. In general, MRAM circuits exploit the electromagnetic properties of magnetoresistive materials to set and maintain information stored within individual magnetic memory cell junctions of the circuit. Typically, a magnetic cell junction is formed from patterning a stack of layers such that a structure of a given length and width may be obtained. In some cases, the patterning process may include wet etching the stack of layers. Such a technique, however, may cause some portions of the stack of layers to be undercut. Consequently, the dimensions of magnetic cell junctions formed from wet etch techniques may vary within an array. In general, variations of cell junction sizes and shapes may cause the amount of current needed to switch the magnetic direction of memory cells to vary, reducing the reliability of the memory array.

As such, in an effort to alleviate the undercut problem, dry etch techniques, such as ion milling and reactive ion etching are sometimes employed to pattern magnetic cell junctions. Such dry etch techniques, however, often cause material removed from the stack of layers to be redeposited upon sidewalls of the patterned magnetic cell junctions. In some cases, the residue may undesirably affect the operation of the ensuing circuit if not removed. In particular, the redeposition of material along the sidewalls of a magnetic cell junction may produce shorts across the tunneling barrier layer of the cell junction, prohibiting the logic state of the magnetic cell junction from being determined. In addition, residue on magnetic layers of MRAM cells may degrade the magnetic properties of the layers, reducing the reliability of the memory cells. Furthermore, residue on portions of conductive structures may undesirably increase the resistance of the structures, hindering the speed of the resulting circuit.

Therefore, it would be desirable to develop a method for patterning a magnetic cell junction with a reduced amount of residue and which does not cause layers within magnetic cell junction to be undercut or shorted. In addition, it would be advantageous to develop a method for removing residue from a topography in which a magnetic cell junction is patterned. Moreover, it would be beneficial to reduce the effect of residues on the operation of magnetic cell junctions.

SUMMARY OF THE INVENTION

The problems outlined above may be in large part addressed by a method for patterning a magnetic cell junction and a topography used for and resulting from such a method. The following are mere exemplary embodiments of the method and topography and are not to be construed in any way to limit the subject matter of the claims.

One embodiment for the method includes patterning a photoresist layer arranged upon a topography, etching portions of the topography adjacent to the patterned photoresist layer and terminating the etching process within a cap film of the topography. The method further includes subsequently removing etch residues from the topography and etching the topography to expose an uppermost magnetic layer of the topography after the etch residues are removed.

Another embodiment for the method includes patterning a first mask layer over a stack of layers having at least two magnetic layers spaced apart by a tunneling layer and etching a first portion of the stack of layers in alignment with the patterned first mask layer to form a first patterned portion of the stack of layers. The method further includes patterning a second dielectric mask layer above the first patterned portion and ion milling a second portion of the stack of layers in alignment with the patterned second dielectric mask layer to form a second patterned portion of the stack of layers.

An exemplary embodiment for the topography may include a stack of layers including at least two magnetic layers spaced apart by a tunneling layer, a first non-magnetic conductive cap layer arranged upon and in contact with an uppermost magnetic layer of the stack of layers and a second non-magnetic conductive cap layer arranged upon and in contact with the first non-magnetic conductive cap layer.

BRIEF DESCRIPTION OF THE DRAWINGS

Other objects and advantages of the invention will become apparent upon reading the following detailed description and upon reference to the accompanying drawings in which.

Figure 1:
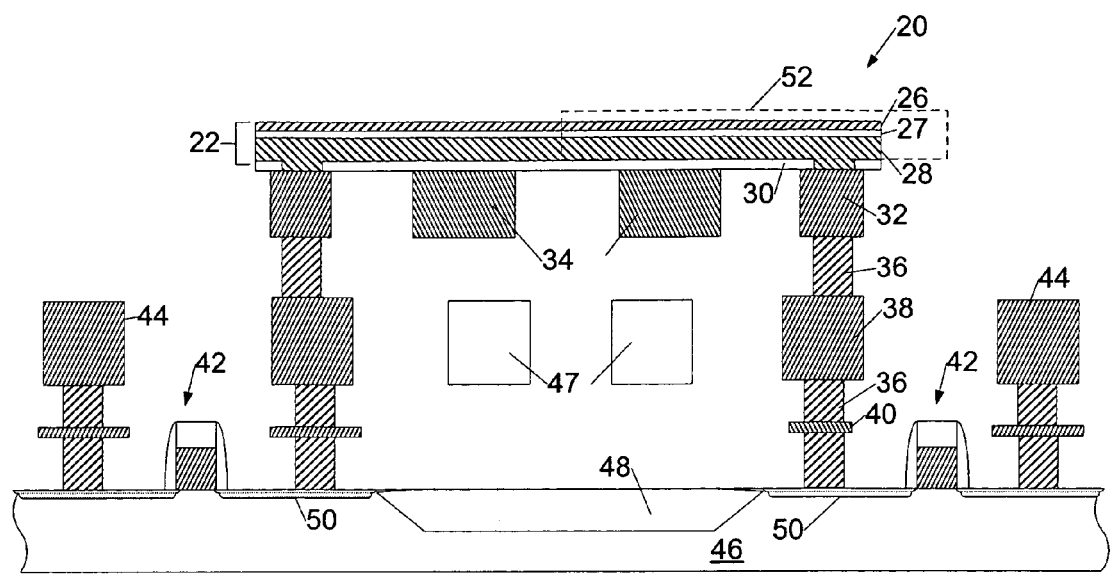
FIG. 1 depicts a partial cross-sectional view of a topography.

While the invention may include various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning to the drawings, exemplary methods for processing a topography for the formation of a microelectronic device are provided. In particular, FIGS. 1–13 illustrate exemplary methods for patterning a magnetic cell junction and removing residue formed from the patterning process. In addition, FIGS. 14–18 illustrate an exemplary method for forming a bit line over a patterned magnetic cell junction. An exemplary topography which may be used for the methods is illustrated in FIG. 1. In particular, FIG. 1 depicts a partial cross-sectional view of topography 20 which includes plurality of layers 22 formed above dielectric 30 and contact structures 32. As will be described in more detail below, plurality of layers 22 may be used to form magnetic cell junctions within topography 20 and, therefore, may include storing portion 26, tunneling barrier layer 27, and pinned portion 28. FIG. 1 illustrates an opening patterned within dielectric layer 30 exposing portions of contact structures 32. As a result, a conductive path may be formed between subsequently formed magnetic cell junctions and underlying portions of topography 20.

Although the topography depicted in FIG. 1 is configured for the fabrication of a magnetic random access memory (MRAM) array, the methods described herein are not necessarily restricted to such an application and, therefore, the methods are not necessarily restricted to the illustrations in the figures. In particular, the methods described herein may be used in any applications in which magnetic layers are employed and, more particularly, applications in which magnetic cell junctions are formed. For example, the methods described herein may be used for processing a topography in which a magnetoresistive read head is formed in a magnetic recording disk drive. As such, the methods described herein may generally be applied to topographies in which microelectronic devices are formed, such as those including semiconductor-based substrates as well as other material substrates.

In some embodiments, FIG. 1 may illustrate a cross-sectional view of a differential memory cell partially fabricated within a MRAM array. Alternatively, however, FIG. 1 may illustrate a cross-sectional view of two single memory cells partially fabricated within an MRAM array. In either case, microelectronic topography 20 may include other memory cells arranged in alignment with the memory cell/s depicted in FIG. 1. In addition, the other memory cells may include substantially similar components as the memory cell/s depicted in FIG. 1. In particular, the other memory cells may include digit lines 34, via plugs 36, additional contact structures 38, interconnects 40, transistor gates 42, ground line 44 and word lines 47 formed above substrate 46 which has isolation regions 48 and diffusion regions 50 arranged therein as shown in FIG. 1. It is noted that word lines 47 are connected to transistor gates 42 along a different cross-sectional plane of topography 20 than shown in FIG. 1. In general, word lines 47 may serve to activate transistor gates 42 such that current may flow from the memory cell to ground line 44. In this manner, current flow may be generated through the subsequently formed magnetic cell junctions such that read operations may be conducted. In general, the dimensions and compositions of dielectric layer 30, digit lines 34, via plugs 36, interconnects 40, transistor gates 42, substrate 46, isolation regions 48, diffusion regions 50, and contact structures 32, 38 and 44 may be in accordance with design specifications generally known in the MRAM array fabrication industry. It is noted that the components of microelectronic topography 20 are not drawn to scale in FIG. 1. For instance, the total thickness of plurality of layers 22 may be on the order of hundreds of angstroms, while the thickness of digit lines 34 may be on the order of thousands of angstroms.

As noted above, plurality of layers 22 may be patterned into magnetic cell junctions of an MRAM array. In general, a magnetic cell junction of an MRAM array may include a dielectric tunneling barrier layer interposed between two magnetic portions such that tunnel magnetoresistance may be employed during the read operations of the array. In particular, a magnetic cell junction of an MRAM array may include a dielectric tunneling barrier layer interposed between one magnetic portion with a fixed magnetic direction and another magnetic portion that does not have a fixed magnetic direction. Consequently, plurality of layers 22 may include tunneling barrier layer 27 interposed between pinned portion 28 with a fixed magnetic direction and storing portion 26 which does not have a fixed magnetic direction. In general, pinned portion 28 and storing portion 26 may include a plurality of layers as described in more detail below. The plurality of layers of each portion, however, is not illustrated in FIG. 1 to simplify the illustration of the drawing.

In general, tunneling barrier layer 27 may be used to pass electrons between the magnetic layers of pinned portion 28 and storing portion 26 of the subsequently formed magnetic cell junctions. More specifically, tunneling barrier layer 27 may serve to provide quantum mechanical tunneling between pinned portion 28 and storing portion 26. Exemplary materials for tunneling barrier layer 27 may include aluminum oxide, aluminum nitride, tantalum oxide, titanium oxide, hafnium oxide, magnesium oxide, or zirconium oxide. In addition, tunneling barrier layer 27 may generally include a thickness between approximately 5 angstroms and approximately 50 angstroms, or more specifically between approximately 6 angstroms and approximately 25 angstroms. Larger or smaller thicknesses of tunneling barrier layer 27 may be appropriate depending on the design specifications of the magnetic cell junction.

Figure 2:
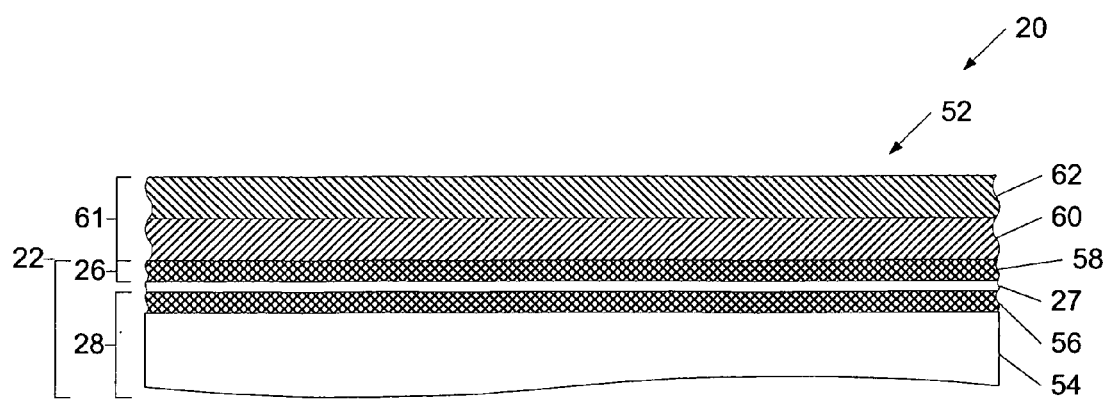
FIG. 2 depicts a cross-sectional view of an upper portion of the topography depicted in FIG. 1 subsequent to the formation of a cap film thereon.

A magnified view of upper portion 52 of microelectronic topography 20, as outlined by the dotted line in FIG. 1, is shown in FIG. 2 to describe an exemplary configuration of layers for pinned portion 28 and storing portion 26 as well as to show the formation of cap film 61 upon storing portion 26 for the fabrication of magnetic cell junction. As shown in FIG. 2, pinned portion 28 may include underlying layers 54 and magnetic layer 56. In general, underlying layers 54 may include any number of layers which may be used with magnetic layer 56 to serve as the reference portion of subsequently formed magnetic cell junction. For example, underlying layers 54 may, in some embodiments, include a coupling layer, another magnetic layer and an antiferromagnetic layer successively arranged below magnetic layer 56. Additional layers may also be included within underlying layers 54, depending on the design specifications of the device. In general, the formation, composition and thicknesses of underlying layers 54 may be in accordance with process and design specifications known in the MRAM fabrication industry.

As shown further in FIG. 2, storing portion 26 may include magnetic layer 58. In general, magnetic layers 56 and 58 may include any magnetic materials, such as cobalt-iron, nickel-iron, nickel-iron-cobalt alloys, cobalt-zirconium-niobium, or cobalt-iron-boron. In some cases, it may be advantageous for the uppermost portion of magnetic layer 58 to include a nickel-iron alloy due to the material's ability to change its magnetic direction easily. In any case, the thickness of magnetic layers 56 and 58 may be generally between approximately 20 angstroms and approximately 100 angstroms. Other magnetic materials that are used in the MRAM fabrication industry and/or other thicknesses, however, may be used for magnetic layers 56 and 58, depending on the design specifications of the magnetic cell junction. In some cases, magnetic layers 56 and 58 may include the same materials and/or thicknesses. In other embodiments, magnetic layers 56 and 58 may include different materials and/or thicknesses.

It is noted that the composition, thickness, number, and arrangement of layers within plurality of layers 22 used may differ from those shown and described in reference to FIG. 2 for the method described herein. In particular, plurality of layers 22 may include additional or fewer layers than shown in FIG. 2. For instance, storing portion 26 and pinned portion 28 may include any number of layers, including but not limited to multiple magnetic layers. In addition, the portions of microelectronic topography 20 illustrated in FIG. 2 are not drawn to scale. In particular, the thickness of plurality of layers 22 are greatly exaggerated to distinguish the layers within storing portion 26 and pinned portion 28. Furthermore, plurality of layers 22 may extend to other regions of topography 20 as indicated by the curved lateral edges of the layers.

As shown in FIG. 2, cap film 61 may be formed upon the upper surface of storing portion 26. In particular, lower layer 60 may be formed upon and in contact with magnetic layer 58 and upper layer 62 may be formed upon and in contact with lower layer 60 to collectively form cap film 61. As will be described in more detail below, forming a dual layer cap film within topography 20 may be advantageous for reducing the generation of residue during the patterning of a magnetic cell junction as well as providing an etch stop for the formation of a via extending between the patterned magnetic cell junction and a subsequently formed bit line. It is noted, however, that the method described herein is not necessarily restricted to embodiments having a dual layer cap film. In particular, the processes described herein may be employed with a single layer cap film or, in other cases, may be employed with a cap film including more than two layers. Consequently, the method described herein should not necessarily be restricted to the configuration of cap film 61 in the figures.

In general, lower layer 60 and upper layer 62 may include non-magnetic conductive materials such that a conductive path may be formed between plurality of layers 22 and subsequently formed overlying portions of topography 20. For example, lower layer 60 and/or upper layer 62 may include a metallic material such as but not limited to aluminum, cobalt, copper, iron, nickel, platinum, tantalum, titanium, tungsten, or a metal alloy, silicide or nitride thereof. Some exemplary materials which may be particularly applicable for lower layer 60 and/or upper layer 62 include but are not limited to tantalum, tantalum nitride, titanium, titanium nitride, titanium-tungsten and tungsten. In some embodiments, lower layer 60 and upper layer 62 may include materials of different etch characteristics such that a variation in etch rate may be detected upon etching cap film 61. For example, in some embodiments, lower layer 60 may include tantalum nitride and upper layer 62 may include tantalum. In alternative embodiments, lower layer 60 may include tantalum nitride and upper layer 62 may include titanium. In yet other cases, lower layer 60 may include tungsten or titanium-tungsten and upper layer 62 may include titanium. Other combinations of materials with different etch characteristics may also be used, depending on the design characteristics of the device.

In applications of MRAM devices, having lower layer 60 include tantalum nitride may be particularly advantageous for improving the switching reliability among the array of magnetic cell junctions. In particular, it has been shown that tantalum nitride has a propensity to lessen the number of "soft errors" within a MRAM array, particularly when the material is in close proximity to the magnetic materials of the storing portion of the magnetic cell junctions. Soft errors, as used herein, may generally refer to occasions when magnetic directions of memory cell junctions are not switched upon a given applied field, thereby allowing a false bit to be unintentionally written to those cells. In order to improve the reliability of the array, it is advantageous to reduce the number of soft errors and, therefore, it is advantageous to have tantalum nitride near the storing portion of the magnetic cell junctions. In addition, tantalum materials tend to etch quickly with fluorocarbon etch chemistries, particularly in comparison with magnetic materials such as nickel-iron and cobalt-iron alloys. As noted below, the etch chemistry used to pattern cap film 61 may, in some embodiments, include fluorocarbon compounds. Consequently, the inclusion of tantalum within lower layer 60 may, in some cases, be beneficial for providing a particularly high selectivity between lower layer 60 and magnetic layer 58. In this manner, cap film 61 may be patterned without affecting the dimensions and/or properties of underlying layers. It is noted, however, highly selective etch processes may be achieved with materials other than tantalum, and, therefore, lower layer 60 is not necessarily restricted to tantalum compounds.

In general, the thicknesses of lower layer 60 and upper layer 62 may depend on the composition of the materials and the etch chemistry used to etch the materials in subsequent applications. An exemplary range of thicknesses, however, may be between approximately 0 angstroms and approximately 600 angstroms and, in some embodiments, between approximately 150 angstroms and approximately 350 angstroms. For instance, in some embodiments, lower layer 60 may include approximately 300 angstroms of tantalumnitride and upper layer 62 may include approximately 300 angstroms of tantalum. Larger or smaller thicknesses may be appropriate for lower layer 60 and/or upper layer 62, depending on the design specifications of the ensuing device. For example, in embodiments in which one of lower layer 60 and upper layer 62 is omitted from cap film 61, the remaining layer may include a thickness greater than approximately 600 angstroms. In particular, cap film 61 may, in some embodiments, include a single layer having a thickness up to approximately 1500 angstroms. As noted in the aforementioned example, lower layer 60 and upper layer 62 may include the same thickness in some embodiments. In other cases, however, lower layer 60 and upper layer 62 may include different thicknesses. In either case, lower layer 60 and upper layer 62 may generally be formed by techniques known in the microelectronic fabrication industry for depositing non-magnetic conductive materials, such as but not limited to chemical vapor deposition and physical vapor deposition.

Figure 3:
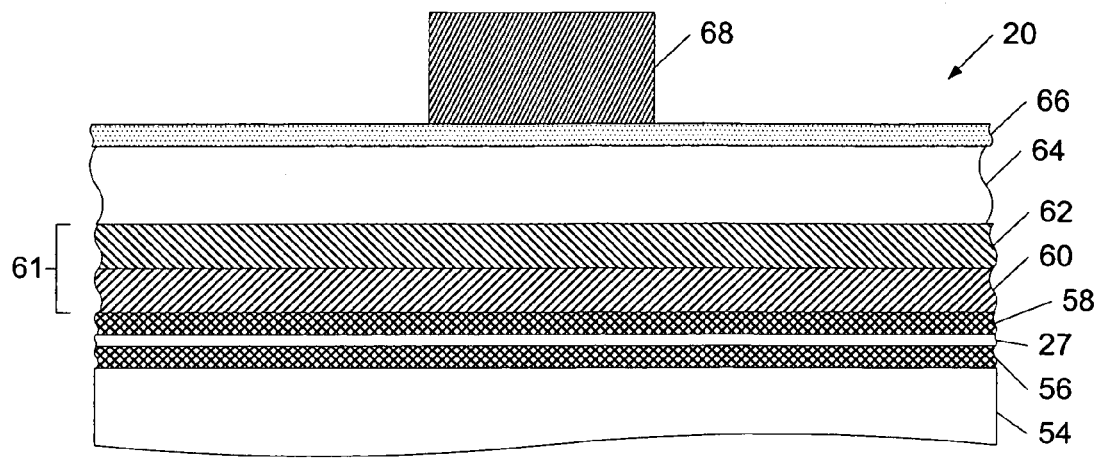
FIG. 3 depicts a cross-sectional view of the topography in which a hardmask layer, an antireflective layer and a patterned photoresist layer have been formed subsequent to formation of the cap film in FIG. 2.

Turning to FIG. 3, hardmask layer 64, anti-reflective layer 66 and photoresist layer 68 are shown formed above upper layer 62. In some embodiments, hardmask layer 64 may include a dielectric such as silicon oxide, silicon nitride, silicon oxynitride or any dielectric material having a low dielectric constant, such as benzocyclobutene (BCB)-type polymers. The use of such dielectric materials during subsequent patterning processes may be advantageous for forming residues which are more easily removed than, for example, residue produced from patterning layers in alignment with photoresist materials as described in more detail below. The thickness of hardmask layer 64 may generally depend on the design specifications of the device and, therefore, may vary widely among applications. As noted below, however, photoresist layer 68 and anti-reflective layer 66 may, in some embodiments, be stripped from topography 20 prior to finishing the patterning process of the underlying layers. In such embodiments, hardmask layer 64 may include a thickness sufficient to protect underlying layers from the patterning process. An exemplary thickness range for hardmask layer 64 may be between approximately 500 angstroms and approximately 2000 angstroms or, more specifically around approximately 1000 angstroms. Larger or smaller thicknesses, however, may be employed.

As shown in FIG. 3, anti-reflective layer 66 may be formed upon and in contact with hardmask layer 64. Anti-reflective layer 66 preferably includes a material with properties that may aid in producing a profile within patterned photoresist layer 68 that meets the design specifications of the device. In particular, the materials used for anti-reflective layer 66 may have properties that aid in minimizing the reflection of energy back toward an energy source and minimizing standing waves within patterned photoresist layer 68 during patterning of the resist layer. In some embodiments, anti-reflective layer 66 may include organic materials. In other embodiments, anti-reflective layer 66 may include inorganic materials. In either embodiment, the thickness of anti-reflective layer 38 may be between approximately 400 angstroms and approximately 1600 angstroms. However, larger and smaller thicknesses of anti-reflective layer 66 may be used depending on the specifications of the device.

Subsequent to the formation of anti-reflective layer 66, photoresist layer 68 may be patterned thereon. The patterning process may be conducted by lithography techniques known in the microelectronic fabrication industry. Although only one patterned photoresist layer is shown in FIG. 3, topography 20 may include any number of patterned photoresist layers above the upper surface of upper layer 62. In addition, the patterned photoresist layers may be formed with various dimensions and spacings therebetween in accordance with the design specifications of the device. In general, photoresist layer 68 may include a deep ultraviolet resist, an I-line resist, a G-line resist, or another resist, such as an e-beam resist or an x-ray resist, including but not limited to 193 nm resists. In addition, the thickness of photoresist layer 68 may be between approximately 1000 angstroms and approximately 10,000 angstroms. Larger or smaller thicknesses of photoresist layer 68, however, may be used depending on the parameters of the fabrication process. In any case, hardmask layer 64, antireflective layer 66 and photoresist layer 68 may collectively protect underlying portions of upper layer 62, lower layer 60 and plurality of layer 22 from subsequent etching and oxidation processes as described in more detail below and, therefore, may be collectively referred to as a mask layer. Alternatively, hardmask layer 64 and photoresist layer 68 may be referred to as separate mask layers.

Figure 4:
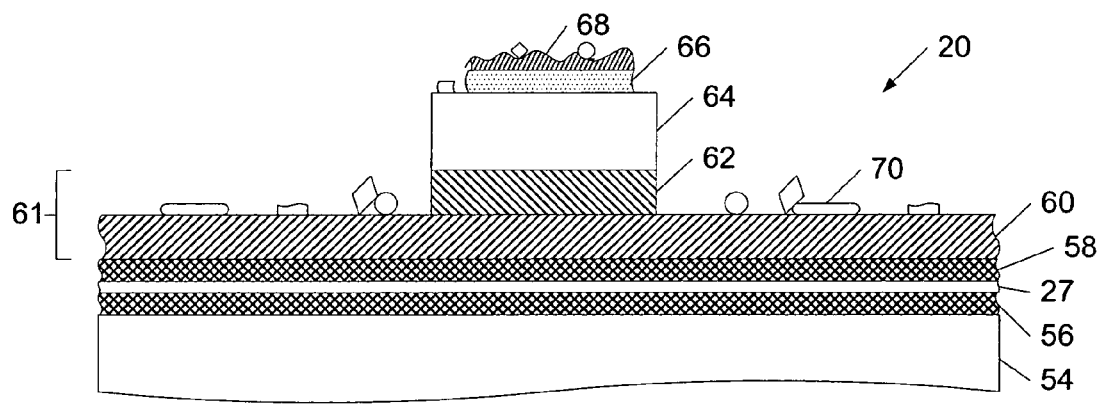
FIG. 4 depicts a cross-sectional view of the topography in which the antireflective layer, hardmask layer and portion of the cap film are patterned subsequent to formation of the hardmask layer, an antireflective layer and a patterned photoresist layer in FIG. 3.

In any case, antireflective layer 66 and hardmask layer 64 may be patterned in alignment with photoresist layer 68. In some embodiments, a portion of cap film 61 may be patterned during the same process as shown in FIG. 4. In particular, portions of topography 20 adjacent to photoresist layer 68 may be etched and such an etching process may, in some embodiments, be terminated within cap film 61. In some embodiments, the etching process may be terminated within upper layer 62 of cap film 61. Alternatively, the etching process may be terminated within lower layer 60 of cap film 61. In yet other embodiments, the etching process may be terminated at an interface between lower layer 60 and upper layer 62 as shown in FIG. 4. In either of the two later embodiments, it may be advantageous for lower layer 60 and upper layer 62 to include materials of different etch characteristics such that etch rates of the process may be monitored to terminate the etching process. Alternatively, the etch process may be terminated at a predetermined time to stop at the interface or within either of lower layer 60 and upper layer 62.

In general, the etch chemistries used to pattern anti-reflective layer 66, hardmask layer 64 and a portion of cap film 61 may depend on the composition of such materials. Exemplary fluorocarbon chemistries that may be particularly applicable for etching tantalum materials within cap film 61 may include but are not limited to carbon tetrafluoride ($CF_4$) and/or trifluoromethane ($CHF_3$). Other fluorocarbon compounds may be used as well or alternatively, depending on the process and design specifications of the circuit. In any case, the etch chemistries may include one or more inert gases, such as but not limited to helium, argon and xenon. Flow rates of the etch chemistries may vary between applications, particularly in reference to etch chamber capabilities and the composition of the materials to be etched. An exemplary flow rate range may be between approximately 50 sccm and approximately 10,000 sccm, but larger or smaller flow rates may be used.

Figure 5:
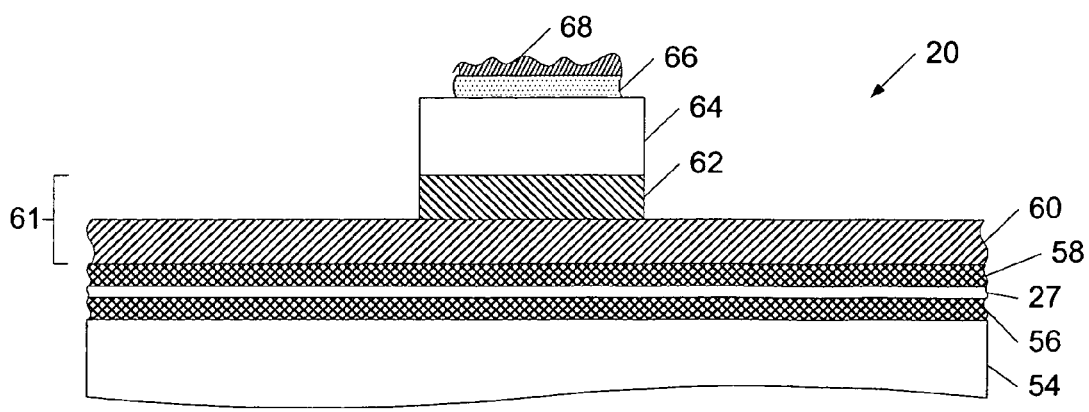
FIG. 5 depicts a cross-sectional view of the topography in which etch residues formed from the patterning process in FIG. 4 are removed.

As shown in FIG. 4, etch residue 70 may be formed upon the upper surface of topography 20 from etching anti-reflective layer 66, hardmask layer 64 and a portion of cap film 61. In some embodiments, although not shown, etch residue 70 may also form upon the sidewalls of hardmask layer 64 and the etched portions of cap film 61. As noted above, residue may undesirably affect the operation of the ensuing circuit if not removed. As such, it may, in some embodiments, be desirable to remove etch residue 70 from topography 20 as shown in FIG. 5. In some cases, etch residue 70 may be removed by wet chemical cleaning processes. In particular, etch residue 70 may be removed by exposing topography 20 to a solvent, such as a mixture of ammonium hydroxide, hydrogen peroxide and water (i.e., $NH_4OH/H_2O_2/H_2O$) which is commercially available as the trade name SC1 from Rhodia, Inc. of Cranbury, N.J. and other suppliers. In general, the SC1 solvent may include, by weight, between about 0.1 and about 10 parts ammonium hydroxide, between about 0.1 and about 10 parts hydrogen peroxide and between about 1 and about 100 parts water. An exemplary ratio of such components may be approximately 1:1:10, although other ratios may be used as well. The solvent may be applied to topography 20 for a duration between approximately 10 seconds and approximately 10 minutes at a temperature between approximately 25° C. and approximately 85° C. Longer or shorter durations and/or higher or lower temperatures, however, may be used, depending on the extent of residue formed upon topography 20.

As noted above, etch residues formed from patterning materials in the presence of photoresist materials may be more difficult to remove than etch residues formed in the absence of photoresist materials, due to the inclusion of the photoresist materials within the residue. The ammonium hydroxide, hydrogen peroxide and water mixture noted above, however, is generally sufficient to remove etch residues formed in the presence of photoresist materials. Consequently, it may be beneficial to use such a solvent for the removal of etch residues 70. In such applications, however, the solvent is not generally selective to removing the residues without etching the layer upon which they are formed. As a result, the dimensions and, in some cases, the properties of the layer may be altered. In addition, wet chemical cleaning processes may, in some embodiments, react with the layer upon which the residue is arranged to form additional residues or polymers. The method described herein, however, accommodates for such shortcomings by terminating the etch process within cap film 61. In particular, since the lower portions of cap film 61 are going to be removed in subsequent processes anyway, forming additional residue or etching remaining portions of cap film 61 during the removal of etch residue 70 is not detrimental to the ensuing device.

Other methods, however, may be used to remove etch residue 70 in some cases. For example, in some embodiments, etch residue 70 may be removed by exposing topography 20 to a hydrogen plasma. In particular, topography 20 may be exposed to a plasma primarily comprising hydrogen such that etch residue 70 may be eradicated from the upper surface of the remaining portions of cap film 61. An advantage of a hydrogen plasma process relative to wet chemical processes is that the plasma does not remove portions of the layer upon which the etch residue is formed and, therefore, the dimensions of such a layer may be substantially maintained. Disadvantages of a hydrogen plasma process relative to wet chemical processes, however, include increased costs and explosion hazards and, therefore, there pros and cons to be considered for each method. A determination of which method is best may vary between applications. For example, in embodiments in which lower layer 60 and/or upper layer 62 include titanium, it may be advantageous to employ a hydrogen plasma process for the removal of etch residue 70 since SC1 is particularly reactive with titanium materials. It is noted, however, that other advantages and/or disadvantages relative to layer composition and/or structural characteristics of a topography may contribute to the selection of the process used to remove etch residues and, therefore, embodiments in which lower layer 60 and/or upper layer 62 include titanium are not necessarily restricted to the use of hydrogen plasma processes.

In general, the reference of "a plasma primarily comprising hydrogen," as used herein, may refer to a plasma comprising a majority of hydrogen ions, radicals and/or molecules relative to other elemental components within the plasma. For example, the "hydrogen plasma" described herein may include more than approximately 40% of hydrogen ions, radicals and/or molecules and, in some embodiments, more than approximately 70% or, more specifically, more than approximately 90% of hydrogen ions, radicals and/or molecules. It is noted that the phrases, "hydrogen plasma," "a plasma primarily comprising hydrogen," "a plasma mainly comprising hydrogen," and "a plasma mostly comprising hydrogen" may be used interchangeably herein to refer to a plasma having a majority of hydrogen ions, radicals and/or molecules.

In general, the hydrogen plasma used to remove etch residue 70 may be generated by the mixture of one or more hydrogen-containing gas chemistries. The hydrogen-containing gas chemistries may include but are not limited to diatomic hydrogen ($H_2$), ammonia ($NH_3$) and a plurality of hydrocarbons ($C_xH_y$, where x is greater than or equal to 1 and y is approximately equal to 4x). In general, the hydrogen-containing gas chemistries may be introduced into a plasma reaction chamber at a rate between approximately 100 sccm and approximately 10,000 sccm. Larger or smaller flowrates, however, may be used, depending on the process parameters of the plasma reaction chamber and the specifications of the fabrication process. In some embodiments, only hydrogen-containing gas chemistries may be used to generate the hydrogen plasma. In other cases, however, one or more supplemental gas chemistries may be mixed with one or more hydrogen-containing gas chemistries to improve the efficiency of the hydrogen plasma cleaning process and/or stabilize the hydrogen plasma against explosion hazards. Some exemplary supplemental gas chemistries which may be used to generate the hydrogen plasma include but are not limited to Ar, $N_2$, $H_2O$, $O_2$, CO, $CO_2$, $CF_4$, $NF_3$, and $SF_6$.

In general, the one or more supplemental gas chemistries may be added at a rate significantly lower than the flowrate of the one or more hydrogen-containing gas chemistries. For example, the one or more supplemental gas chemistries may be mixed with one or more hydrogen-containing gas chemistries at a ratio between approximately 1:5 and approximately 1:1000. Using such a ratio range and the range of flowrates noted above for the one or more hydrogen-containing gas chemistries, the flow rates of the one or more supplemental gas chemistries may, in some embodiments, be between approximately 2 sccm and approximately 1000 sccm. Larger or smaller flowrates, however, may be used, depending on the process parameters of the plasma reaction chamber and the specifications of the fabrication process.

In any case, several different types of plasma reaction chambers may be used to generate the hydrogen plasma. In some embodiments, the quality and/or efficiency of the hydrogen cleaning process may be correlated with the number of hydrogen radicals reacting with etch residue 70. As such, in some embodiments, the hydrogen plasma may be generated within a microwave (MW) sourced plasma reaction chamber or a remote plasma reaction chamber, which have a propensity to produce higher concentrations of radicals than ions. In other embodiments, the hydrogen plasma may be generated within a radio-frequency (RF) based plasma reaction chamber, a RF-MW (RF coupled with MW) sourced plasma reaction chamber or another type of plasma reaction chamber which generates a substantial amount of ions as well as radicals. In general, the effect of the type plasma reaction chamber used to generate the hydrogen plasma on the quality and/or efficiency of the hydrogen plasma cleaning process may depend on the composition of etch residue 70 and remaining portions of cap film 61. In addition, it is speculated that the gas chemistries used within the hydrogen plasma may have an effect on efficiency of the plasma reaction chamber used. Consequently, although the reaction of hydrogen radicals with etch residue 70 may, in some embodiments, be associated with a higher quality or efficient hydrogen plasma cleaning process, high quality and/or efficiencies may also result with the reaction of ions with etch residue 70 or a combination of ions and radicals with etch residue 70.

Regardless of the type of plasma reaction chamber used, the hydrogen plasma cleaning process may generally be conducted in a relatively low pressure atmosphere. For example, the hydrogen plasma may be generated at a pressure between approximately 1 mTorr and approximately 5 Torr and, more specifically, between approximately 1 Torr and approximately 2 Torr. In addition, the hydrogen plasma cleaning process may be conducted with a substrate temperature between approximately 20° C. and approximately 300° C. Furthermore, the power applied to the plasma reaction chamber during the hydrogen plasma cleaning process may be between approximately 300 W and approximately 3000 W. Higher or lower temperatures, pressures and/or power, however, may be used, depending on the process parameters of the fabrication process and the capabilities of the process reaction chamber tool used. The duration of the hydrogen plasma cleaning process may be generally be sufficient to remove etch residue 70 and, therefore, may depend on the amount and composition of the residue produced from etching anti-reflective layer 66, hardmask layer 64 and a portion of cap film 61 as well as the gas chemistries used within the hydrogen plasma. Exemplary process times for the hydrogen plasma cleaning process, however, may be between approximately 10 seconds and approximately 5 minutes.

In addition to removing etch residue 70, the hydrogen plasma cleaning process may form a hydride layer upon remaining portions of cap film 61. In particular, the hydrogen plasma cleaning process may diffuse hydrogen atoms within remaining portions of cap film 61 and bond the hydrogen atoms with the atoms of the cap film layer to form a hydride layer. Consequently, a metal hydride may be formed upon the exposed surfaces of cap film 61. In general, the metal hydride layer may be formed to a thickness between approximately 2 angstroms and approximately 30 angstroms or, more specifically, between approximately 5 angstroms and approximately 20 angstroms. Larger or smaller thicknesses, however, may be formed, depending on the concentration of hydrogen within the hydrogen plasma and the duration of the hydrogen plasma cleaning process.

In an alternative approach to removing residues from topography 20, an oxygen plasma (i.e., a plasma comprising a majority of oxygen ions, radicals and/or molecules relative to other elemental components) may be used to oxidize etch residue 70. In particular, an oxygen plasma may be used to oxidize etch residue 70 such that it forms a dielectric layer upon the topography. During such a process, remaining portions of cap film 61 are inevitably oxidized. In some embodiments, underlying portions of magnetic layer 58 may be oxidized as well since the vertical diffusion of an oxidation process is typically difficult to control. As discussed in more detail below in reference to FIG. 9, portions of magnetic layer 58 may be oxidized in some embodiments in order to define the boundaries of the storing portion of the ensuing magnetic cell junction. As such, oxidizing portions of magnetic layer 58 may not be detrimental to the ensuing device. Consequently, oxidizing topography 20 is a viable option for removing etch residue 70. It is noted, however, that the oxidation process should be controlled to prevent the oxidation of magnetic layer 56, reasons for which will be described in more detail below in reference to FIG. 9. In addition, it is preferred that the oxidation process not exceed a processing temperature of 250° C. in order to prevent the properties of the magnetic layers 56 and 58 from being altered.

A disadvantage of oxidizing magnetic layer 58 for the removal of residue 70 is that the vertical portion of conductive material within the layer will be reduced and, in some embodiments, eliminated. Such a reduction in conductive material will reduce the area in which to decipher a change in etch characteristics during the patterning of remaining portions of cap film 61 described in more detail below in reference to FIG. 7. As a result, the likelihood of terminating such an etch process within magnetic layer 58 is reduced. In turn, since tunneling layer 27 is relatively thin, the likelihood of etching through to magnetic layer 56 is increased. In some cases, etching through to magnetic layer 56 may detrimentally affect the functionality of the ensuing device. In particular, etching through to magnetic layer 56 may induce a variation of thickness across the layer, which may alter the direction at which the magnetic vectors are stored as well as alter the strength at which the magnetic vectors are fixed. In some cases, such alterations may decrease the reliability of an ensuing device or render an ensuing device inoperable. In addition, etching through to magnetic layer 56 will expose the layer to the formation of residue and oxidation on the upper surface of the layer, which may alter the properties of the layer, affecting the functionality of an ensuing device. Due to such concerns, it may not be advantageous to expose topography 20 to an oxygen plasma to oxidize etch residue 70 unless the depth of the oxidation can be controlled within the remaining portions of cap film 61.

Turning back to FIG. 4, it is shown that the patterning process of anti-reflective layer 66, hardmask layer 64 and a portion of cap film 61 may further etch portions of photoresist layer 68. In addition, FIG. 4 illustrates end portions of patterned antireflective layer 66 etched. In some embodiments, the upper corners of hardmask layer 64 may be etched as well from the patterning process, but is not illustrated in FIG. 4 to exemplify the sensitivity of photoresist layer 68 to the etch chemistry used to pattern the underlying layers. In some cases, the thickness of photoresist layer 68 and/or the etch chemistry used to pattern anti-reflective layer 66, hardmask layer 64 and a portion of cap film 61 may be configured such that a majority or bulk portion of photoresist layer 68 is removed as shown in FIG. 4. In this manner, the processing time to subsequently remove photoresist layer 68, as described in more detail below in reference to FIG. 6, may be reduced. In some embodiments, the thickness of photoresist layer 68 and/or the etch chemistry may be configured such that all of photoresist layer 68 and, in some cases, a bulk portion or all of antireflective layer 66 is removed during the patterning process. In such embodiments, the stripping process described in reference to FIG. 6 below may be omitted.

In general, determining such thicknesses for photoresist layer 68 and anti-reflective layer 66 may be dependent on their composition as well as the chemistry used to etch the topography and the thickness of the layers to be etched. An exemplary thickness range for a majority of photoresist layer 68 to be removed during the patterning process of anti-reflective layer 66, hardmask layer 64 and a portion of cap film 61 may generally be between approximately 5000 angstroms and 9000 angstroms, and more specifically, between approximately 6500 angstroms and 8000 angstroms. An exemplary thickness range for a majority of antireflective layer 66 to be removed during the patterning process may generally be between approximately 600 angstroms and 1200 angstroms, and more specifically, between approximately 700 angstroms and 900 angstroms. Larger or smaller thicknesses for photoresist layer 68 and anti-reflective layer 66, however, may be used, depending on the design specifications of the ensuing device.

Figure 6:
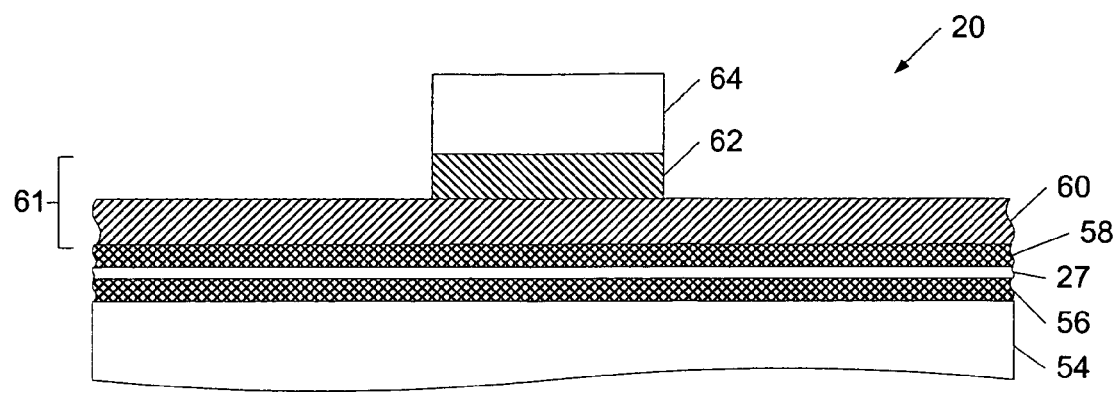
FIG. 6 depicts a cross-sectional view of the topography in which the remaining portion of the patterned photoresist layer and antireflective layer are removed subsequent to the removal of the etch residues in FIG. 5.

As shown in FIG. 6, photoresist layer 68 and antireflective layer 66 may be removed if any portions remain above hardmask layer 64 subsequent to the patterning process described in reference to FIG. 4. In general, the removal process may include any wet or dry etch techniques known in the microelectronic fabrication industry for stripping photoresist and antireflective materials from topographies. For example, in some embodiments, a plasma including nitrogen, oxygen and/or steam may be used to remove photoresist layer 68 and antireflective layer 66 from topography 20 without substantially removing the materials of cap film 61 and hardmask layer 64. In some embodiments, the stripping process may be performed subsequent to the removal of etch residue 70 as shown by the succession of drawings in FIGS. 5 and 6. In other embodiments, however, the removal of photoresist layer 68 and antireflective layer 66 may be conducted prior to the removal of etch residue 70 and, therefore, the processes described in reference to FIGS. 5 and 6 may be reversed.

In either case, removing photoresist 68 from topography 20 prior to exposing magnetic layer 58 may advantageously lessen the difficulty at which to remove etch residues formed from subsequent patterning processes, such as the one described below in reference to FIG. 7. In particular, etch residue formed from patterning materials in the presence photoresist materials, as noted above, may be more difficult to remove than etch residues formed in the absence of photoresist materials, due to the inclusion of the photoresist materials within the residue. In addition, as noted above, it may be particularly advantageous to remove residue from the surfaces of magnetic layers to prevent the degradation of their magnetic properties, which may reduce the reliability of the memory cells. As such, it may be particularly advantageous to remove residue formed from a patterning process using photoresist materials before magnetic layer 58 is exposed.

Figure 7:
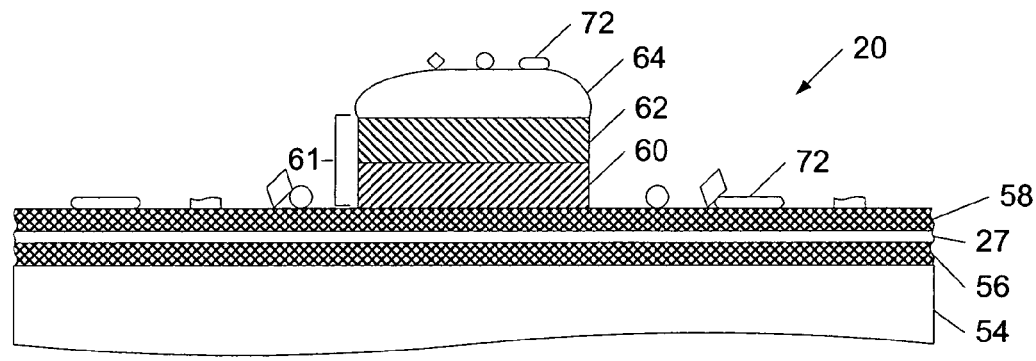
FIG. 7 depicts a cross-sectional view of the topography in which a lower portion of the cap film is patterned subsequent to the removal of the patterned photoresist layer and the antireflective layer in FIG. 6.

Turning to FIG. 7, remaining portions of cap film 61 adjacent to patterned hardmask layer 64 may be removed to expose magnetic layer 58. In general, the etch process may be configured to provide a high level of selectivity between lower layer 60 and magnetic layer 58. More specifically, the etch process may be configured with an etch chemistry which etches lower layer 60 at a relatively high rate and comparatively etches magnetic layer 58 at a relatively low rate. In this manner, etch process may be terminated upon exposure of magnetic layer 58 without etching a significant portion thereof. In some cases, the etch chemistry may additionally or alternatively be configured to increase the selectivity of the etch process by the production of a residue upon the etched surface. In particular, the etch chemistry may be configured to form residue (or polymer) 72 upon the upper surface of magnetic layer 58 as illustrated in FIG. 7. Although not shown, residue 72 may also form upon the sidewalls of hardmask layer 64 and the upper layer 62 and lower layer 60 in some embodiments.

In any case, a buildup of residue 72 may, in some embodiments, inhibit the etch process to access to magnetic layer 58 without significantly impeding the rate of removal of lower layer 60. Consequently, the amount of magnetic layer 58 etched after removal of lower layer 60 may be further minimized by the formation of residue 72. It is noted that residue 72 is distinct from etch residue 70 formed during the patterning process of the upper portion of cap film 61 described above in reference to FIG. 4. In particular, residue 72 is not formed in the presence of a photoresist and, therefore, does not include photoresist material. In addition, the formation of residue 72 is intentional to increase the selectivity between lower layer 60 and magnetic layer 58, while the formation of residue 70 is a result of patterning in the presence of a photoresist.

In some embodiments, the etch chemistry used to etch remaining portions of lower layer 60 arranged adjacent to hardmask layer 64 may include any fluorine or halogen-containing materials. Etch chemistries including such materials may be particularly advantageous for forming organo-metallic residue and providing an etch selectivity on the order of approximately 70:1 between metal and magnetic materials. In some cases, the etch chemistry may be applied as a plasma to help facilitate such a selectivity and the formation of residue 72. In other cases, however, the etch chemistry may applied as a wet etch process. Although a plasma etch process is preferred, a wet etch process may, in some embodiments, offer a relatively high selectivity sufficient to inhibit etching of magnetic layer 58 and, therefore, may be used for etching remaining portions of cap film 61 in some cases.

In some embodiments, a fluorocarbon etch chemistry may offer a particularly high degree of selectivity between metal and magnetic materials and, therefore, may be preferred for etching remaining portions of cap film 61 in some cases. Exemplary fluorocarbon chemistries that may be used to etch remaining portions of cap film 61 and form residue 72 include but are not limited to carbon tetrafluoride ($CF_4$) and/or trifluoromethane ($CHF_3$). Other fluorocarbon compounds may be used as well or alternatively, depending on the process and design specifications of the circuit. Exemplary flow rates of the etch chemistry used to pattern remaining portions of cap film 61 may generally range between approximately 50 sccm and approximately 10,000 sccm. Larger or smaller flow rates, however, may be used in accordance with the process parameters of the etch chamber and the design specifications of the device subsequently formed.

Figure 8:
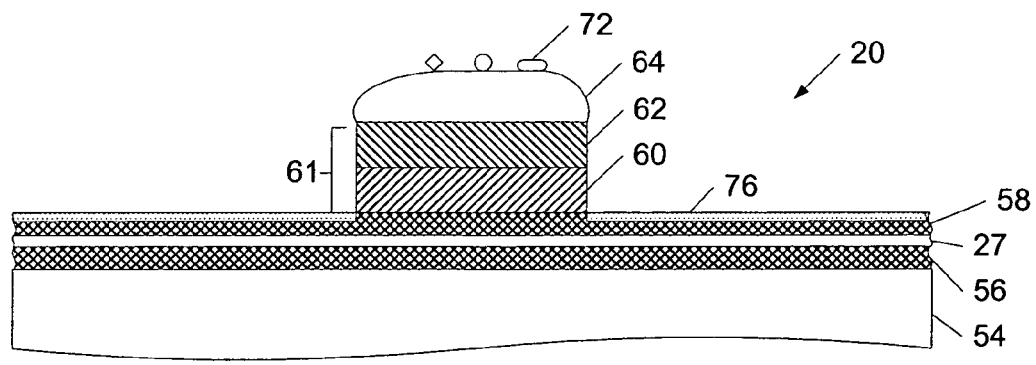
FIG. 8 depicts a cross-sectional view of the topography in which residue formed from the patterning process in FIG. 7 is removed.

As noted above, residue on magnetic layers may degrade the magnetic properties of the layers, reducing the reliability of the memory cells. As such, it may, in some embodiments, be desirable to remove etch residue 72 from magnetic layer 58 as shown in FIG. 8. In some cases, etch residue 72 may be removed by wet chemical cleaning processes. In particular, etch residue 72 may be removed by exposing topography 20 to a solvent, such as a mixture of ammonium hydroxide, hydrogen peroxide and water (i.e., $NH_4OH/H_2O_2/H_2O$) similar to the one described above in reference to FIG. 5. The use of such a solvent may include similar process parameters as described above in reference to FIG. 5, particularly in regard to the ratio of components, duration and temperature. As noted above, however, wet chemical cleaning processes are not generally selective to removing residues without etching the layer upon which they are formed. As a result, the dimensions and, in some cases, the properties of the layer may be altered. In addition, wet chemical cleaning processes may, in some embodiments, react with the layer upon which the residue is arranged to form additional residues or polymers. Although such issues were not detrimental for the removal of etch residue 70 in FIG. 5, the consequence of such reactions for the removal of residue 72 may be harmful if not detrimental to the functionality of the ensuing device. In particular, etching magnetic layer 58 and/or forming additional residues thereon may alter the dimensional and magnetic properties of magnetic layer 58, affecting the reliability of an ensuing device.

In an alternative approach to removing residues 72 from topography 20, an oxygen plasma (i.e., a plasma comprising a majority of oxygen ions, radicals and/or molecules relative to other elemental components) may be used to oxidize the residue similar to the manner described above for oxidizing etch residue 70. In particular, an oxygen plasma may be used to oxidize residue 70 such that a dielectric layer is formed upon topography 20. Although some or all of the residue may be removed during such an oxygen plasma process, portions of magnetic layer 58 are inevitably oxidized. In some cases, oxidizing portions of magnetic layer 58 may be advantageous, particularly when regions of magnetic layer 58 are slated to be oxidized in subsequent processes to define the boundaries of the storing portion of the ensuing magnetic cell junction as described in more detail below in reference to FIG. 9.

In some cases, however, the vertical and lateral extent of oxidation during an oxygen plasma cleaning process may be difficult to control. As a consequence, layers underlying magnetic layer 58 may be oxidized. Such a vertical extent of oxidation may be undesirable for some circuits. For example, in some cases, the lower portions of a magnetic cell junction may be formed to have a larger width than that of the upper portion of the magnetic cell junction and, therefore, it may not be desirable to oxidize lower magnetic layers of a topography. In addition, it may be undesirable for oxidation to diffuse into lateral portions of the topography, shortening the width an upper portion of the magnetic cell junction possibly to the extent of being out of the design specifications of the device.

An alternative technique for removing residue 72 which does not etch or oxidize magnetic layer 58 includes exposing topography 20 to a hydrogen plasma. The process may be similar to the hydrogen plasma cleaning process described above in reference to FIG. 5. In addition, the process may be similar to the hydrogen plasma cleaning method described in U.S. patent application Ser. No. 10/979,072 to Choi et al. filed Oct. 29, 2004, which is incorporated by reference as if fully set forth herein. In particular, topography 20 may be exposed to a hydrogen plasma generated from a mixture of one or more hydrogen-containing gases, such as but are not limited to diatomic hydrogen ($H_2$), ammonia ($NH_3$) and $C_xH_y$, where x is greater than or equal to 1 and y is approximately equal to 4x. In addition, the hydrogen plasma may, in some embodiments, include one or more supplemental gas chemistries to improve the efficiency of the hydrogen plasma cleaning process and/or stabilize the hydrogen plasma against explosion hazards. Some exemplary supplemental gas chemistries which may include but are not limited to Ar, $N_2$, $H_2O$, $O_2$, CO, $CO_2$, $CF_4$, $NF_3$, and $SF_6$.

In general, the hydrogen-containing gas chemistries may be introduced into a plasma reaction chamber at a rate between approximately 100 sccm and approximately 10,000 sccm. In general, the one or more supplemental gas chemistries may be added at a rate significantly lower than the flowrate of the one or more hydrogen-containing gas chemistries. For example, the one or more supplemental gas chemistries may be mixed with one or more hydrogen-containing gas chemistries at a ratio between approximately 1:5 and approximately 1:1000. Using such a ratio range and the range of flowrates noted above for the one or more hydrogen-containing gas chemistries, the flow rates of the one or more supplemental gas chemistries may, in some embodiments, be between approximately 2 sccm and approximately 1000 sccm. Larger or smaller flowrates for the hydrogen-containing gas chemistries and the one or ore supplemental gas chemistries, however, may be used, depending on the process parameters of the plasma reaction chamber and the specifications of the fabrication process.

In some embodiments, it may be advantageous to minimize the oxidation of topography 20 and, therefore, it may be advantageous to minimize the amount of oxygen within the hydrogen plasma. For example, it may be desirable to minimize the amount of oxygen within the hydrogen plasma to minimize the vertical and/or lateral extent of oxidation within magnetic layer 58 during the hydrogen plasma cleaning process and during subsequent oxidation processes. More specifically, it may be advantageous to minimize the vertical extent of oxidation within magnetic layer 58 such that magnetic layer 56 is not oxidized during the hydrogen plasma cleaning process and/or during subsequent oxidation processes. Oxidation of magnetic materials within magnetic layer 56 may undesirably alter the magnetic properties of the materials, affecting the strength of the fixed magnetic direction set within such a layer. As a consequence, the operation of a magnetic cell junction fabricated therefrom may be impaired or may fail to function properly, reducing the reliability of the device. Furthermore, oxidizing topography 20 when portions of residue 72 are still arranged thereon may induce non-uniform oxidation within the topography. The irregularity of oxidation thickness within topography 20 during the hydrogen plasma cleaning process may lead to further oxidation non-uniformity within the topography during subsequent oxidation processes, possibly causing portions of magnetic layer 56 to be oxidized.

In addition, it may be advantageous to minimize the lateral extent of oxidation within magnetic layer 58 during the fabrication of a MRAM memory cell such that the width of an upper portion of a magnetic cell junction formed from magnetic layer 58 is not shortened out of the design specifications of the memory cell during the hydrogen plasma cleaning process and/or during subsequent oxidation processes. Fabricating an upper portion of a memory cell out of its design specifications may undesirably affect the ability of the upper portion to change its magnetic direction upon application of magnetic fields and, consequently, may affect the reliability of an ensuing device. "Lateral extent of oxidation," as used herein, may generally refer to the degree to which an oxidation process extends from side to side within a layer, particularly in a direction which is substantially parallel with a substrate upon which the topography is formed.

In some embodiments, the hydrogen plasma may not include gas chemistries including oxygen and, therefore, may not be susceptible to oxidizing magnetic layer 58 during the hydrogen plasma cleaning process. In other embodiments, however, the hydrogen plasma may include small quantities of oxygen, such as from supplemental gas chemistries $H_2O$, $O_2$, CO and/or $CO_2$, for example. In such embodiments, the concentration of oxygen within the hydrogen plasma may, in some cases, be small enough such that magnetic layer 58 is not oxidized or is not substantially oxidized. The reference of magnetic layer 58 "not being substantially oxidized" may refer to the layer having less than 10% and, in some cases, less than 5% of the layer oxidized during the hydrogen plasma process. Such a level of oxidation may not be detrimental to the properties of underlying layers and, therefore, supplemental gas chemistries including oxygen may be added in small concentrations in some embodiments. For example, supplemental gas chemistries including oxygen may be added in concentrations such that the number of oxygen ions, radicals and/or molecules within the plasma is less than approximately 5% and, more specifically, less than approximately 2% of all ions, radicals and/or molecules included in the plasma. Larger or smaller concentrations of oxygen within the hydrogen plasma may be used, however, in accordance with the specifications of the fabrication process.

The hydrogen plasma cleaning process may generally be conducted in a relatively low pressure atmosphere, such as between approximately 1 mTorr and approximately 5 Torr and, more specifically, between approximately 1 Torr and approximately 2 Torr. In addition, the hydrogen plasma cleaning process may be conducted with a substrate temperature between approximately 20° C. and approximately 300° C. Furthermore, the power applied to the plasma reaction chamber during the hydrogen plasma cleaning process may be between approximately 300 W and approximately 3000 W. Higher or lower temperatures, pressures and/or power, however, may be used, depending on the process parameters of the fabrication process and the capabilities of the process reaction chamber tool used. The duration of the hydrogen plasma cleaning process may be generally be sufficient to remove residue 72 and, therefore, may depend on the amount and composition of the residue produced from etching magnetic layer 58 as well as the gas chemistries used within the hydrogen plasma. Exemplary process times for the hydrogen plasma cleaning process, however, may be between approximately 10 seconds and approximately 5 minutes.

In some embodiments, the quality and/or efficiency of the hydrogen cleaning process may be correlated with the number of hydrogen radicals reacting with residue 72. As such, in some embodiments, the hydrogen plasma may be generated within a microwave (MW) sourced plasma reaction chamber or a remote plasma reaction chamber, which have a propensity to produce higher concentrations of radicals than ions. In other embodiments, the hydrogen plasma 72 may be generated within a radio-frequency (RF) based plasma reaction chamber, a RF-MW (RF coupled with MW) sourced plasma reaction chamber or another type of plasma reaction chamber which generates a substantial amount of ions as well as radicals.

In some cases, the effect of the type of plasma reaction chamber used to generate the hydrogen plasma on the quality and/or efficiency of the hydrogen plasma cleaning process may depend on the composition of residue 72 and magnetic layer 58. For example, the generation of a hydrogen plasma within a MW sourced plasma reaction chamber for the removal of residue comprising tantalum-nitride upon a nickel-iron layer was found to be effective for removing the residue relative efficiently. In contrast, RF and RF-MW plasma reaction chambers used to generate hydrogen plasmas for a similar topography were found to be slightly less efficient. It is theorized, however, that RF and RF-MW plasma reaction chamber processes may be optimized to facilitate similar if not better removal efficiencies than the efficiency obtained with the MW plasma reaction chamber. In addition, it is speculated that the gas chemistries used within the hydrogen plasma may have an effect on efficiency of the plasma reaction chamber used. Consequently, although the reaction of hydrogen radicals with residue 72 may, in some embodiments, be associated with a higher quality or efficient hydrogen plasma cleaning process, high quality and/or efficiencies may also result with the reaction of ions with residue 72 or a combination of ions and radicals with residue 72.

In addition to removing residue 72, the hydrogen plasma cleaning process may form hydride layer 76 upon magnetic layer 58 as shown in FIG. 8. In particular, the hydrogen plasma cleaning process may diffuse hydrogen atoms within magnetic layer 58 and bond the hydrogen atoms with the atoms of the magnetic layer to form a hydride layer. As shown in FIG. 8, hydride layer 76 may be formed within and/or grown upon the upper surface of magnetic layer 58. In some embodiments, hydride layer 76 may include a thickness between approximately 2 angstroms and approximately 30 angstroms or, more specifically, between approximately 5 angstroms and approximately 20 angstroms. Hydride layer 76 may, however, be formed to smaller or larger thicknesses depending on the concentration of hydrogen within the hydrogen plasma and the duration of the hydrogen plasma cleaning process. As will be described in more detail below in reference to FIG. 9, hydride layer 38 may, in some embodiments, inhibit the lateral and vertical extent of a subsequent oxidation process such that magnetic layer 56 and unexposed regions of magnetic layer 58 may not be substantially oxidized.

As shown in FIG. 8, the hydrogen plasma cleaning process may be sufficient to substantially remove residue 72 from the upper surfaces of magnetic layer 58. The process, however, may not, in some embodiments, remove all of the residue from the upper surface of hardmask layer 64. Subsequent to the hydrogen plasma cleaning process, topography 20 may be rinsed with deionized water. Although such a rinsing process may be beneficial for removing loose debris or byproducts resulting from the hydrogen plasma cleaning process, it may not be sufficient to remove residue 72 adhered to the upper surface of hardmask layer 64. Consequently, a method for removing residue 72 adhered to the upper surface of hardmask layer 64 is described in more detail below in reference to FIG. 13.

In some embodiments, topography 20 may be additionally or alternatively rinsed with deionized water prior to the hydrogen plasma cleaning process. For example, topography 20 may, in some embodiments, be rinsed with deionized water subsequent to the etching lower layer 60 and prior to the hydrogen plasma cleaning process. In addition or alternatively, topography 20 may be rinsed with deionized water prior to and/or subsequent to removing etch residue 70 and/or etching the upper portion of cap film 61. In any case, the flow rates and durations of the rinsing processes are preferably sufficient to remove loose debris from topography 20 and, consequently, may differ depending on the composition of materials included in topography 20 as well as the processes performed prior to the rinsing process. Exemplary flow rates and durations, however, may generally be between approximately 100 ml/s and approximately 500 ml/s for a time period between approximately 10 seconds and approximately 5 minutes. In some embodiments, one or more of the aforementioned rinsing processes may be omitted from the method described herein.

Figure 9:
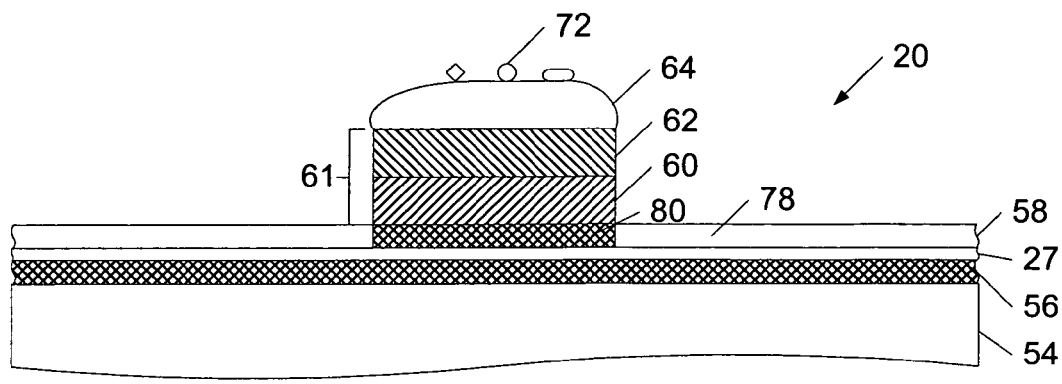
FIG. 9 depicts a cross-sectional view of the topography in which exposed portions of a magnetic layer are oxidized subsequent to the removal of residue in FIG. 8.

Turning to FIG. 9, exposed portions of magnetic layer 58 may be oxidized, forming dielectric portions 78 on either side of unoxidized portion 80 underlying patterned cap film 61. As shown in FIG. 9, the oxidation process may include oxidizing the full thickness of magnetic layer 58, which may advantageously inhibit shorts from forming across tunneling layer 27 during a subsequent patterning process. In particular, oxidized portions 78 may be formed as a dielectric material and, therefore, the deposition of conductive etch residue along the sidewall of tunneling layer 27 may not short to magnetic layer 56. In some embodiments, the oxidation process may be configured to extend into tunneling layer 27 without extending into magnetic layer 56 or portions of magnetic layer 58 underlying patterned cap film 61. Such a retardation of vertical and lateral oxidation may prevent the magnetic properties of magnetic materials within magnetic layer 56 from being altered. In addition, the lateral boundaries of unoxidized portion 80 may be formed in alignment with patterned cap film 61 and, therefore, an upper portion of a magnetic memory cell may be formed having a width within design specifications of the memory cell. As a result, the reliability of an ensuing memory cell may not be substantially affected by the oxidation of magnetic layer 58.

In general, the retardation of the vertical and lateral extent of the oxidation process may be attributed to the presence of hydride layer 76. In particular, it is theorized that, during the oxidation process, oxygen atoms displace the hydrogen atoms within hydride layer to other portions of topography 20. More specifically, it is theorized that the oxidation process drives the hydrogen atoms from hydride layer 76 to tunneling layer 27 and, in some cases, to magnetic layer 56. In addition, it is postulated that the hydrogen atoms are laterally diffused to portions of magnetic layer 58 underlying patterned cap film 61 (depicted as unoxidized portion 80 in FIG. 9). It is believed the hydrogen atoms passivate the atoms within such portions of topography 20 such that oxygen atoms are not allowed to diffuse into such portions. As a result, magnetic layer 56 and portions of magnetic layer 58 underlying patterned cap film 61 are not substantially oxidized.

As noted above, in order to oxidize the entirety of portions 78, portions of tunneling layer 27 may, in some embodiments, be oxidized. In other embodiments, however, the entirety of portions 78 may be oxidized without oxidizing portions of tunneling layer 27. In either case, the oxidation process may produce uniform oxidation through topography 20. In particular, the thickness of regions of topography 20 oxidized from the oxidation process may not differ by more than approximately 10% and, in some cases, not more than 5% of the total thickness of the oxidized regions. Such uniformity may, in part, be achieved by the removal of residue 72 prior to the oxidation process. In addition, the limitation of vertical oxidation by the presence of hydride layer 76 may aid in producing uniform oxidation within topography 20. Furthermore, the uniformity of the oxidation process may, in some embodiments, depend on the process used to perform the oxidation process.

In general, the oxidation process may include any oxidation process known in the industry of microelectronic device fabrication. For example, in some embodiments, the oxidation process may be a plasma primarily comprising oxygen or, in some cases, a plasma consisting essentially of oxygen. In such cases, the oxidation process may be conducted in the same chamber as the hydrogen plasma cleaning process. Alternatively, the oxidation process and the hydrogen plasma cleaning process may be conducted in different plasma chambers. In yet other embodiments the oxidation process may include exposure to a non-plasma atmosphere including oxygen. For example, oxygen may be added to an ion milling chamber to produce a non-plasma oxygen atmosphere with which to oxidize topography 20. In yet other embodiments, topography 20 may be exposed to an oxygen anneal. Other oxidation processes known in the microelectronic fabrication industry may be used as well or alternatively, depending on the design characteristics of the device.

As noted above, the hydrogen plasma process described in reference to FIG. 8 may be configured to remove nearly all of residue 72 from the upper surface of magnetic layer 58. In alternative embodiments, however, the hydrogen plasma cleaning process may be configured to remove less than all of residue 72 arranged upon the upper surface of magnetic layer 58 and a subsequent oxygen plasma process may be used to remove remaining portions of residue 72 from the upper surface of magnetic layer 58. Such a process may be similar to the method described in reference to FIGS. 6–9 in U.S. patent application Ser. No. 10/979,072 to Choi et al. filed Oct. 29, 2004, which is incorporated by reference as if fully set forth herein. In general, the hydrogen plasma cleaning process in such embodiments may include a shorter processing time than embodiments in which the entirety of residue 72 is removed. In addition, the hydride layer resulting from the shortened processing time may be formed to a shallower depth than hydride layer 76.

Subsequent to the shortened hydrogen plasma cleaning process, an oxygen plasma cleaning process may be performed to remove the remaining portions of residue 72. Such a process may be similar to the oxygen plasma cleaning process described above in reference to FIG. 5. In some cases, topography 20 may continue to be exposed to the oxygen plasma subsequent to the removal of residue 72 and until exposed portions of magnetic layer 58 are oxidized, resulting in a structure similar to the one shown in FIG. 9. In other embodiments, however, the oxygen plasma may be terminated prior to oxidizing the full thickness of magnetic layer 58. In such cases, topography 20 may be rinsed and then continue to the process described in reference to FIG. 9. In either case, the use of an oxygen plasma subsequent to a hydrogen plasma may, in some embodiments, facilitate a faster removal of residue 72 as compared to embodiments in which a hydrogen plasma alone is used to remove residue 72 from the upper surface of magnetic layer 58.

Figure 10:
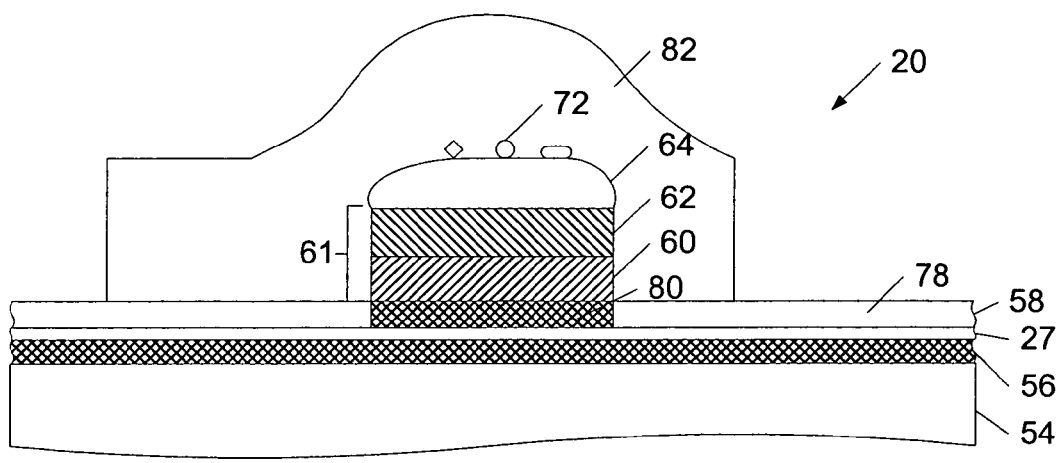
FIG. 10 depicts a cross-sectional view of the topography in which a hardmask layer is formed subsequent to the oxidation of the magnetic layer in FIG. 9.

Turning to FIG. 10, hardmask layer 82 may be formed upon oxidized portions 78 and the patterned layers of hardmask layer 64 and cap film 61. Hardmask layer 82 may include a dielectric such as silicon oxide, silicon nitride, silicon oxynitride or any dielectric material having a low dielectric constant, such as benzocyclobutene (BCB)-type polymers. The use of such dielectric materials during subsequent patterning processes may be advantageous for forming residues which are more easily removed than, for example, residue produced from patterning photoresist materials. As shown in FIG. 10, hardmask layer 82 may be patterned. Such a patterning process may employ forming a patterned photoresist layer and, in some cases, an antireflective layer above hardmask layer 82 and subsequently etching hardmask layer 82 in alignment with the photoresist layer. In general, the etch chemistries used to pattern hardmask layer 82 may depend on the composition of the layer and may be selective to etching hardmask layer 82 at a faster rate than oxidized portions 78. Exemplary fluorocarbon chemistries that may be used include but are not limited to carbon tetrafluoride ($CF_4$) and/or trifluoromethane ($CHF_3$) with the addition of one or more inert gases in some cases. An exemplary flow rate range may be between approximately 50 sccm and approximately 10,000 sccm, but larger or smaller flow rates may be used.

Prior to etching portions of topography 20 in alignment with hardmask layer 82, the photoresist layer and antireflective layer are preferably removed such that etch residue including photoresist materials are minimized. The thickness of hardmask layer 82 may generally depend on the design specifications of the device and, therefore, may vary widely between applications. In general, however, hardmask layer 82 may include a thickness sufficient to protect underlying layers from a subsequent patterning process. An exemplary thickness range for hardmask layer 82 may be between approximately 500 angstroms and approximately 2000 angstroms. Larger or smaller thicknesses, however, may be employed.

Figure 11:
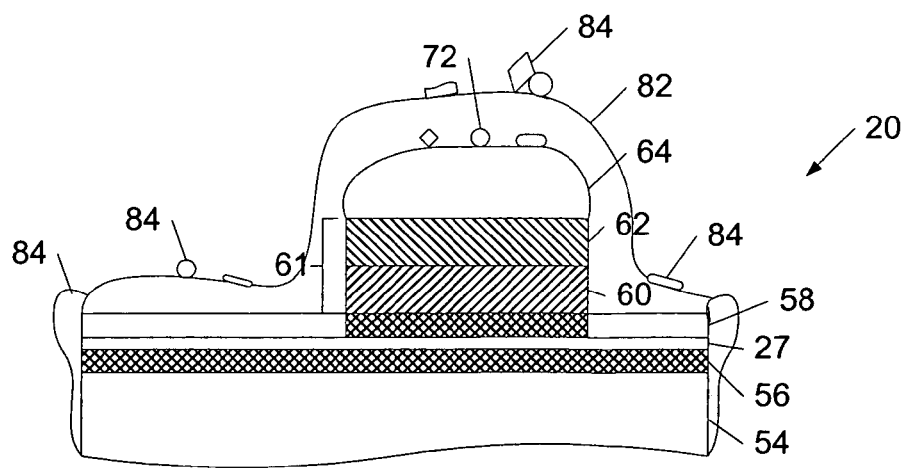
FIG. 11 depicts a cross-sectional view of the topography in which exposed portions of the topography are patterned in alignment with the hardmask layer formed in FIG. 10.

As shown in FIG. 11, exposed portions of topography 20 may be patterned in alignment with hardmask layer 82. In particular, exposed portions of oxidized portions 78 and respective underlying portions of tunneling layer 27, magnetic layer 56 and underlying layers 54 may be etched such that a lower portion of a magnetic cell junction may be defined. In some embodiments, the etch process may include ion milling the exposed portions of topography 20 with argon and/or xenon. In general, ion milling may form the lower portion of the magnetic cell junction with substantially vertical sidewalls (i.e., ion milling may inhibit the undercutting of layers during the patterning process). As a result, the layers may be formed within the dimensional specifications of the device and the magnetic properties may not be substantially altered.

In some embodiments, as shown in FIG. 11, etch residue 84 may be formed upon the upper surface and sidewalls of topography 20 from the ion milling process. As with etch residue 72, it may be advantageous to remove the portions of etch residue 84 overlying cap film 61 such that contact to cap film 61 during subsequent processing may not be hindered. An exemplary process for removing portions of etch residue 84 and 72 above patterned cap film 61 is described in more detail below in reference to FIGS. 12 and 13. As noted below, such an exemplary removal process is not configured to remove portions of etch residue 84 which is not arranged above cap film 61. The presence of such residue within an ensuing device, however, will not, for the most part, affect the operation of the device and, therefore, removal of the residue in not generally necessary. In particular, the method described herein is configured to embed residue 84 residing upon the upper surface of the topography between two dielectric materials, namely hardmask layer 82 and dielectric 86, isolating the residue from contact with the conductive layers of the topography. In addition, since the sidewalls of patterned topography 20 includes oxidized portions 78, etch residue 84 formed along such sidewalls cannot cause a short between the storing portions and pinned portions of the magnetic cell junction. Furthermore, electrical testing of devices subsequently formed from topography 20 has shown no shorts are formed along the sidewalls of magnetic layer 56 and underlying layer 54, indicating the portions of etch residue 84 formed in such regions are not conductive.

As a precautionary measure, topography 20 may, in some embodiments, be oxidized subsequent to patterning magnetic layer 58, tunneling layer 27, magnetic layer 56 and underlying layer 54 to insure the portions of etch residue 84 formed along the sidewalls of the patterned structure are not conductive and, therefore, will not cause shorts to be formed. In general, the oxidation process may include any oxidation process known in the industry of microelectronic device fabrication. For example, in some embodiments, the oxidation process may be a plasma primarily comprising oxygen or, in some cases, a plasma consisting essentially of oxygen. In yet other embodiments the oxidation process may include exposure to a non-plasma atmosphere including oxygen. For example, oxygen may be added to an ion milling chamber to produce a non-plasma oxygen atmosphere. In yet other embodiments, topography 20 may be exposed to an oxygen anneal. Other oxidation processes known in the microelectronic fabrication industry may be used as well or alternatively, depending on the design characteristics of the device.

Figure 12:
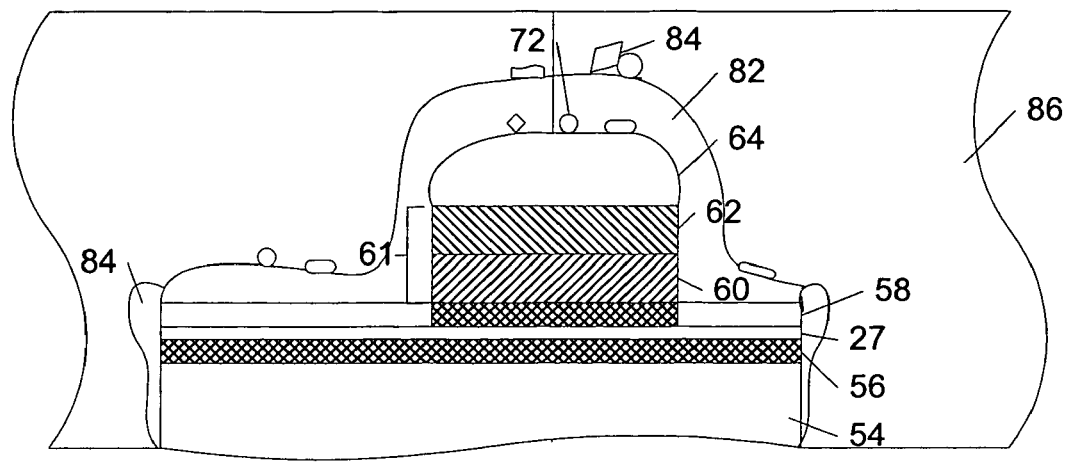
FIG. 12 depicts a cross-sectional view of the topography in which a dielectric layer is deposited and polished above the hardmask layers subsequent to the patterning process in FIG. 11.

As shown in FIG. 12, dielectric 86 may be deposited upon topography 20. In general, dielectric 86 may include one or more layers of dielectric material, including but not limited to silicon oxide, silicon nitride, silicon oxynitride, any dielectric material having a low dielectric constant, such as benzocyclobutene (BCB)-type polymers, aluminum oxide or polyimid. In addition, dielectric 86 may be formed above and around the patterned magnetic cell junction formed from the process steps described above. Subsequent to its formation, dielectric 86 may be polished as shown in FIG. 12. In some cases, dielectric 86 may be polished to a level above hardmask layer 82. In particular, the upper surface of dielectric 86 may be polished to have an upper surface approximately 200 angstroms to approximately 1400 angstroms above hardmask layer 82. In other embodiments, dielectric 86 may be polished to levels within hardmask layer 82 or hardmask layer 64. In such embodiments, polishing the surfaces of hardmask layer 82 and hardmask layer 64 may, in some cases, cause the respective etch residues arranged thereon to agglomerate and form a film on the surface of the polished topography. The film is a form of residue and, therefore, may undesirably affect the operation of the ensuing circuit if not removed. As such, regardless of the level to which dielectric 86 is polished to, the method described herein may include a process for removing etch residues 72 and 84 arranged above patterned cap film 61 and/or films formed from polishing such etch residues. An exemplary removal process is described in more detail below in reference to FIG. 13.

In some embodiments, the polishing process may be a fixed abrasive polishing process. In particular, the polishing process may include placing topography 20 against an abrasive surface having particles, such as cerium oxide, cerium dioxide, α aluminum oxide, γ aluminum oxide, silicon dioxide, titanium oxide, chromium oxide or zirconium oxide fixed therein and setting the abrasive surface and/or the topography in motion relative to each other. Further, the abrasive surface may be substantially rigid such that it does not significantly deform relative to the topography of topography 20. More specifically, the abrasive surface preferably does not conform to the surface of topography 20 and therefore, does not come in contact with elevationally recessed regions of topography 20. As such, elevationally raised regions of the topography are removed at a faster rate than elevationally recessed regions, and global planarization over relatively large areas may be accomplished. In addition, the polishing rate of a fixed abrasive system significantly decreases upon forming a substantially planar surface and, therefore, may substantially self-terminate upon forming a substantially planar surface. It is noted that a chemical-mechanical polishing process including a flexible polishing pad and a liquid including particulate matter may be used to polish dielectric 86 in some embodiments. Such a process may not be as susceptible to decreasing its polish rate upon forming a planar surface and, therefore, may need to be closely monitored to stop the process at a predetermined point.

In some embodiments, the fixed abrasive polishing process may include placing a liquid substantially free of particulate matter between topography 20 and the abrasive surface such that polishing debris may be removed. In some cases, the presence of such a solution may additionally allow the abrasive surface to glide more smoothly across topography 20, wearing away elevationally raised regions of the topography. In addition or alternatively, the polishing solution may help protect topography 20 from being scratched by debris generated from the polishing process. In any case, the polishing solution is preferably adapted such that no chemical reaction occurs between the solution and topography 20. Such an adaptation may be accomplished by maintaining the pH of the solution between approximately 6.0 and approximately 8.0. An acid or a base may be diluted slightly with water to achieve a desired pH value less or greater than 7.0, respectively. In other embodiments, deionized water substantially free of particulate matter may be applied between the topography and the abrasive polishing surface. In such an embodiment, the pH of the deionized water may be maintained at a neutral value (i.e., non-acidic and non-alkaline) of approximately 7.0. In yet other cases, the fixed abrasive polishing process may not include the application of a polishing solution. More specifically, topography 20 may be polished without the use of any liquid.

In yet other embodiments, a chemical-mechanical polishing (CMP) process may be used to planarize dielectric 86. A conventional CMP process typically involves dispensing an abrasive, fluid-based chemical suspension, often referred to as a "slurry," in the space between a polishing pad and a topography surface such that the chemical in the slurry may react with the surface material being polished. In addition to physically removing some material from the surface of the semiconductor topography, the rotational movement of the polishing pad relative to the topography causes abrasive particles entrained within the slurry to physically strip reacted surface material from the topography. Therefore, the process employs a combination of chemical stripping and mechanical polishing to form a planarized surface. Regardless of whether CMP or fixed abrasive polishing techniques are used to polish dielectric 86, a post-planarization cleaning step may be needed to remove residual polishing particles from the surface of the polished topography.

Figure 13:
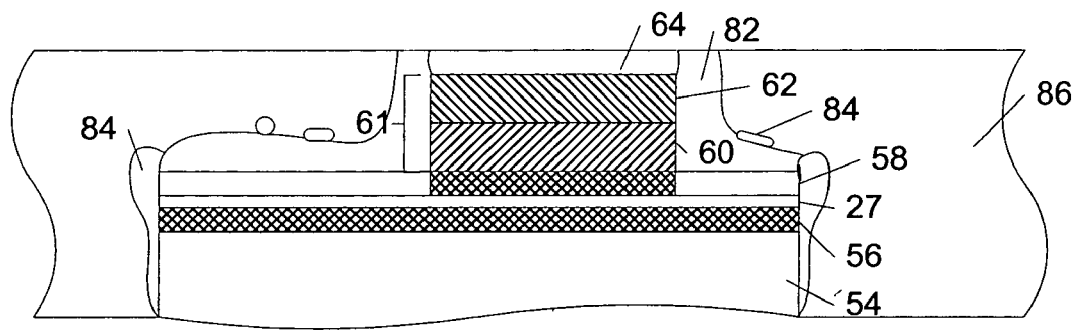
FIG. 13 depicts a cross-sectional view of the topography in which portions of the dielectric layer and hardmask layers are ion milled subsequent to the formation of the dielectric layer in FIG. 12.

Subsequent to the planarization of dielectric 86, portions of dielectric 86 and hardmask layers 82 and 64 may be etched to a level spaced above magnetic layers 58 and 56. Such a process may be configured to specifically etch the layers to a level below etch residues 84 and, in some cases, embedded etch residues 72 such that they may be eradicated from topography 20. As shown in FIG. 13, etch residues 84 formed upon portions of hardmask layer 82 overlying the patterned lower portion of the magnetic cell junction may not be removed during such a process. The presence of such residue within an ensuing device, however, will not, for the most part, affect the operation of the device and, therefore, removal of the residue in not generally necessary. In particular, the method described herein is configured to embed residue 84 between two dielectric materials of hardmask layer 82 and dielectric 86 and, therefore, isolates the residue from contact with the conductive layers of the topography.

In any case, the etching process may include ion milling topography 20 with argon and/or xenon. In some embodiments, the ion milling process may be configured to terminate at a level within cap film 61. For example, the ion milling process may be configured to terminate at the upper surface of upper layer 62, at the interface of upper layer 62 and lower layer 60, or at other levels within upper layer 62 and lower layer 60. In yet other embodiments, the ion milling process may be configured to terminate at a level above cap film 61 as shown in FIG. 13. For example, the ion milling process may be configured to terminate etching portions of dielectric 86 and hardmask layers 82 and 64 at a level at least approximately 50 angstroms above upper layer 62. In such cases, exposure of upper layer 62 may be prevented and etch residues formed from ion milling the conductive material may not be formed upon the layer. In general, residues on the surface of upper layer 62 may undesirably increase the resistance of the layer, inhibiting the electrical connection of a conductive structure subsequently fabricated thereon.

Figure 14:
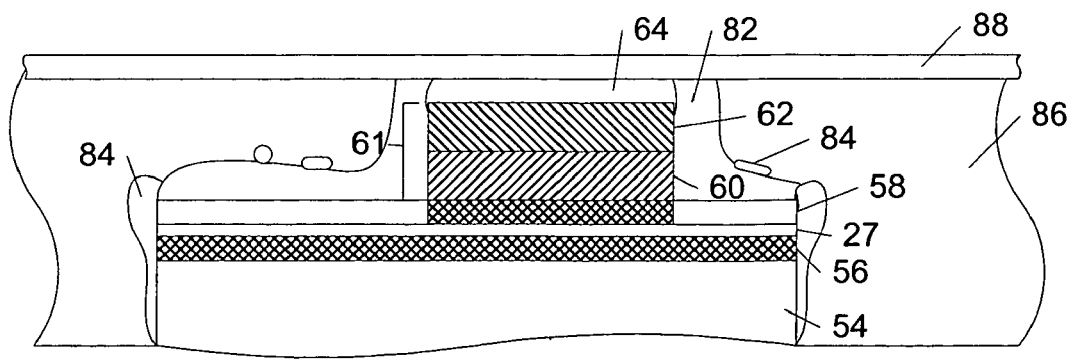
FIG. 14 depicts a cross-sectional view of the topography in which a spacer dielectric layer is formed subsequent to the ion milling process in FIG. 13.

Turning to FIG. 14, dielectric spacer 88 may be formed upon the ion milled surface of dielectric 86 and hardmask layers 82 and 64. Dielectric spacer 88 may generally serve to isolate upper layer 62 from a bit line subsequently formed above the patterned magnetic cell junction, which is described in more detail below in reference to FIGS. 17 and 18. In general, dielectric spacer 88 may include any dielectric material, including but not limited to silicon dioxide, silicon nitride, silicon oxynitride and any dielectric material having a low dielectric constant, such as benzocyclobutene (BCB)-type polymers. In addition, the thickness of dielectric spacer 88 may vary depending on the design specifications of the device. In some embodiments, it may be particularly advantageous to form a bit line in close proximity to the patterned magnetic cell junction or, more specifically, the magnetic layers of the magnetic cell junction and, therefore, it may be advantageous to minimize the thickness of dielectric spacer 88. For example, it may be advantageous to form a bit line spaced less than approximately 1500 angstroms above the patterned magnetic cell junction such that the magnetic field generated from such a line may not be substantially diminished at the magnetic cell junction. As such, dielectric spacer 88 may be formed to have a thickness less than 1500 angstroms in some cases, or more specifically, between approximately 300 angstroms and approximately 1000 angstroms. Larger or smaller distances, however, may be employed between the patterned magnetic cell junction and a subsequently bit line and, therefore, larger or smaller thicknesses for dielectric spacer 88 may be appropriate in some embodiments.

Figure 15:
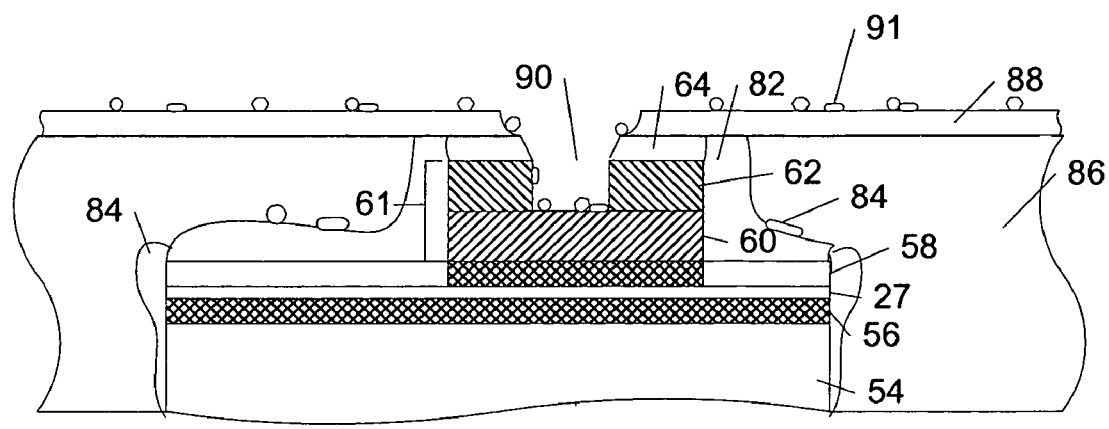
FIG. 15 depicts a cross-sectional view of the topography in which a via opening is formed within the spacer dielectric layer and remaining hardmask layer subsequent to the formation of the spacer dielectric layer in FIG. 14.

As shown in FIG. 15, via opening 90 may be formed within dielectric spacer 88 and hardmask layer 64 over the patterned magnetic cell junction. As noted above in reference to FIG. 13, hardmask layer 64 may, in some cases, be removed during an etch process to remove etch residues 84 and 72 and, therefore, via opening 90 may not be formed within hardmask layer 64 in some embodiments. In either case, via opening 90 may be formed to expose a portion of cap film 61 such that electrical connection may be made to a subsequently formed bit line. For example, via opening 90 may, in some embodiments, extend to the interface between upper layer 62 and lower layer 60 as shown in FIG. 15. In other embodiments, via opening 90 may be extend to regions within either of upper layer 62 and lower layer 60. In general, the formation of via opening 90 may include lithography processes known in the art of fabrication. In some embodiments, via opening 90 may be formed with a narrower width than cap film 61 as shown in FIG. 15. In other embodiments, however, via opening 90 may be formed having a width of substantially the same size or larger than the width of cap film 61. In either case, via opening 90 may be formed upon any lateral portion of cap film 61 and, therefore, is not restricted to a central position as shown in FIG. 15.

FIG. 15 illustrates the portion of via 90 within dielectric spacer 88 and hardmask layer 64 may be formed with concave upper sidewalls and sloped lower sidewalls in some embodiments. Such an etch profile may, in some cases, be formed by a sequence of wet etching followed by a dry anisotropic etch. In general, the wet etch process may conducted by immersing the patterned wafer in an etching agent (e.g. aqueous buffered hydrofluoric acid having a buffering ratio of from about 2:1 to about 50:1) for a length of time sufficient to remove approximately 10% to approximately 60% of the combined thickness of dielectric spacer 88 and hardmask layer 64. The dry etch process may be conducted by conventional methods known to those of ordinary skill in the art for the etching of openings through a dielectric, such as reactive ion etching or radio-frequency (RF) plasma etching. Exemplary etchants which may be used for the dry etch process include but are not limited to $SF_6$, $Cl_2$, $C_nH_xF_y$ (where $n \geq 1$, $x \geq 1$, and $y \geq 1$, preferably a mixture of $CHF_3/C_2F_6$), HF, HCl, $CCl_4$, and mixtures thereof.

In some embodiments, the formation of via 90 within dielectric spacer 88 and hardmask layer 64 may include treating the surface of dielectric spacer 88 with a wet etch selectivity-enhancing composition prior to the formation of a photoresist material used to pattern via 90. An exemplary surface treatment process is described in U.S. Pat. No. 5,968,851 to Geha et al. issued Oct. 19, 1999, which is incorporated by reference as if fully set forth herein. In general, the surface treating step may provide an exposed surface roughness of approximately 3.5–5.0 angstroms Ra as measured by atomic force microscopy techniques. Such a surface roughness may be obtained by etching dielectric spacer 88 with aqueous hydrofluoric acid (HF), which may be diluted and/or buffered, e.g. with aqueous ammonium fluoride. Examples of suitable HF buffering ratios (e.g. parts by weight of 40% aqueous $NH_4F$ to parts by weight of concentrated HF) include 2:1 to 200:1. An example of a commercially available etching material is BHF 15:1 LP W/FC93 by Ashland Chemical Co. Typically, a buffered oxide etch (BOE) is conducted for a length of time sufficient to remove approximately 50–100 angstroms of dielectric layer, to result in the desired surface roughness and/or lateral-to vertical etch ratio. For example, when an HF buffering ratio of approximately 50:1 is desired, surface etching may be conducted for about 60 seconds.

It is noted that the aforementioned pre-patterning surface treatment of dielectric spacer 88 is not necessarily needed for the formation of via 90. In addition, dielectric spacer 88 and hardmask layer 64 may be etched to have a profile different from the profile depicted in FIG. 15. For example, in some embodiments, the portion of via 90 within dielectric spacer 88 and hardmask layer 64 may be formed with convex sidewalls. In yet other embodiments, the sidewalls portion of via 90 may be sloped from the upper surface of dielectric spacer 88 through hardmask layer 64. Furthermore, the etch process of dielectric spacer 88 and hardmask layer 64 is not restricted to the two-step wet etch/dry etch process noted above. In particular, dielectric spacer 88 and hardmask layer 64 may be etched using a single etch process in some embodiments. Alternatively, dielectric spacer 88 and hardmask layer 64 may be etched with more than two etch processes, including those exclusive to wet etch techniques, those exclusive to dry etch techniques and any combination of wet etch and dry etch techniques. In some cases, dielectric spacer 88 and hardmask layer 64 may be etched with the same process as used to etch cap film 61 described below.

In general, the etch chemistries used to form via opening 90 within cap film 61 may depend on the composition of the materials of the cap film. Exemplary fluorocarbon chemistries that may be particularly applicable for etching tantalum materials within cap film 61 may include but are not limited to carbon tetrafluoride ($CF_4$) and/or trifluoromethane ($CHF_3$). Other fluorocarbon compounds may be used as well or alternatively, depending on the process and design specifications of the circuit. In other embodiments, chlorine-based etch chemistries may be used, such as in embodiments in which titanium materials are included within cap film 61. Exemplary chlorine-based chemistries may include but are not limited to chlorine ($Cl_2$) and/or boron trichloride ($BCl_3$). In any case, the etch chemistries may include one or more inert gases, such as but not limited to helium, argon and xenon. Flow rates of the etch chemistries may vary between applications, particularly in reference to etch chamber capabilities and the composition of the materials to be etched. An exemplary flow rate range may be between approximately 50 sccm and approximately 10,000 sccm, but larger or smaller flow rates may be used. In some embodiments, the via opening within cap film 61 may be formed with a single etch chemistry. In other cases, the via opening within cap film 61 may be formed with multiple etch chemistries such as, but not limited to, one for etching lower layer 60 and another for etching upper layer 62.

Figure 16:
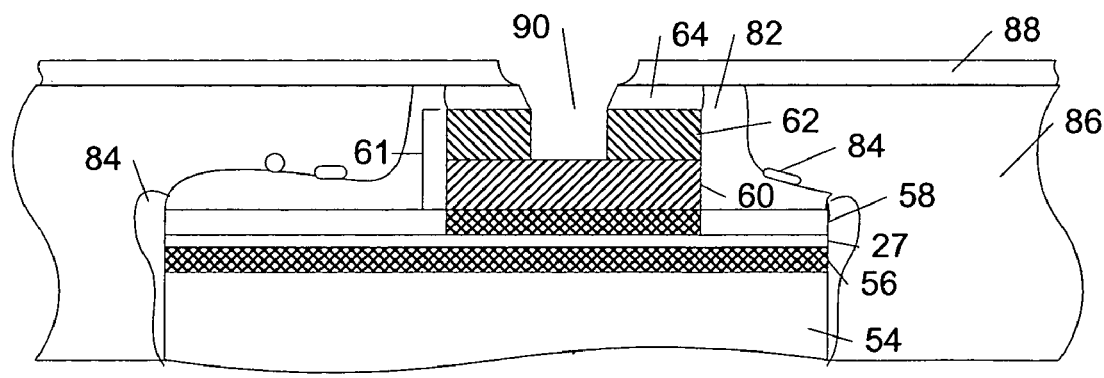
FIG. 16 depicts a cross-sectional view of the topography in which etch residues formed from the etching process in FIG. 15 are removed.

As shown in FIG. 15, etch residue 91 may be formed upon the upper surface of topography 20 during the formation of via 90. In some cases, residue may undesirably affect the operation of the ensuing circuit if not removed. In particular, residue may undesirably increase the contact resistance of the exposed portion of cap film 61, increasing the impedance between the underlying magnetic cell junction and the subsequently formed bit line. As such, it may, in some embodiments, be desirable to remove etch residue 91 from topography 20 as shown in FIG. 16. In some cases, etch residue 91 may be removed by wet chemical cleaning processes. In particular, etch residue 91 may be removed by exposing topography 20 to a solvent, such as SC1 which is described above in reference to the removal of residue 70 in FIG. 5. More specifically, topography 20 may be exposed to a solvent mixture including, by weight, between about 0.1 and about 10 parts ammonium hydroxide, between about 0.1 and about 10 parts hydrogen peroxide and between about 1 and about 100 parts water. An exemplary ratio of such components may be approximately 1:1:10, although other ratios may be used. The solvent may be applied to topography 20 for a duration between approximately 10 seconds and approximately 10 minutes at a temperature between approximately 25° C. and approximately 85° C. Longer or shorter durations and/or larger or smaller temperatures, however, may be used, depending on the extent of residue formed within via 91.

As noted above in reference to the removal of etch residue 70 in FIG. 5, although SC1 is generally effective for removing etch residues, the solvent mixture is not generally selective to the layer upon which etch residues are formed. As a result, exposed portions of cap film 61 may be partially removed during the removal of etch residue 91. The via etch process described in reference to FIG. 15, however, may be configured to terminate within cap film 61, particularly at an elevation above magnetic layer 58 such that cap film 61 is not etched through during the SC1 process. In this manner, magnetic layer 58 may not be exposed and, therefore, alteration of its magnetic properties may be averted.

In addition or alternative to using a wet etching removal process, other methods may be used to remove etch residue 91 in some cases. For example, in some embodiments, etch residue 91 may be removed by exposing topography 20 to a hydrogen plasma process, such as the one described above in reference to FIGS. 5 and 8 for the removal of etch residue 70 and 72, respectively. In particular, topography 20 may be exposed to a plasma primarily comprising hydrogen such that etch residue 91 may be eradicated from the upper surface of the exposed portions of cap film 61 as well as other portions of topography 20. An advantage of a hydrogen plasma process relative to wet chemical processes is that the plasma does not remove portions of the layer upon which the etch residue is formed and, therefore, the dimensions of such a layer may be substantially maintained. Disadvantages of a hydrogen plasma process relative to wet chemical processes, however, include increased costs and explosion hazards and, therefore, there pros and cons to be considered for each method. A determination of which method is best may vary between applications. For example, in embodiments in which lower layer 60 and/or upper layer 62 include titanium, it may be advantageous to employ a hydrogen plasma process for the removal of etch residue 91 since SC1 is particularly reactive with titanium materials. It is noted, however, that other advantages and/or disadvantages relative to layer composition and/or structural characteristics of a topography may contribute to the selection of the process used to remove etch residues and, therefore, embodiments in which lower layer 60 and/or upper layer 62 include titanium are not necessarily restricted to the use of hydrogen plasma processes.

Figure 17:
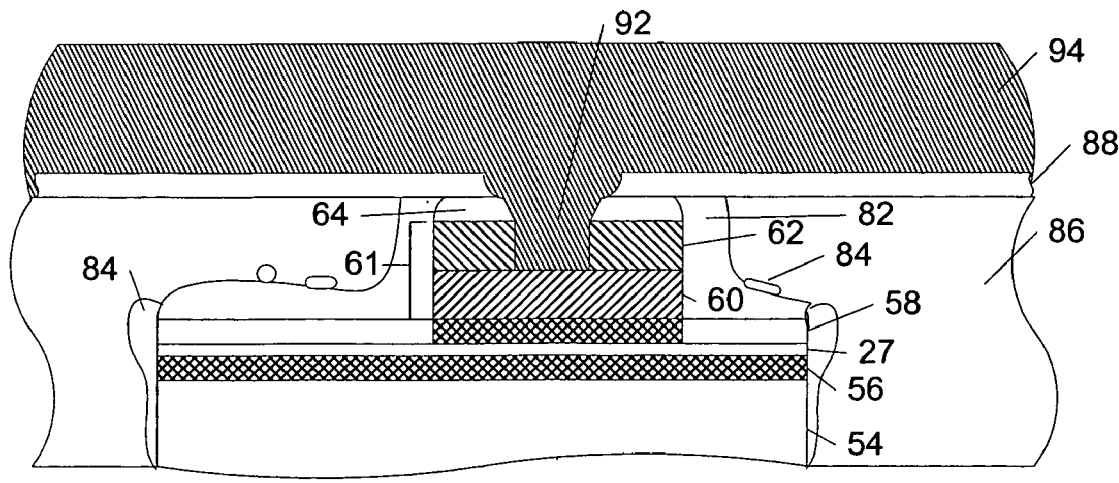
FIG. 17 depicts a cross-sectional view of the topography in which a conductive material is deposited into the via opening and upon adjacent portions of the topography subsequent to the formation of the via opening in FIG. 16.

Subsequent to the formation of via opening 90 and the removal of etch residues 91, conductive material 94 may be deposited upon topography 20 as shown in FIG. 17. In particular, conductive material 94 may be deposited within via opening 90 forming via 92 extending between an upper surface of cap film 61 and an underlying surface of a bit line subsequently formed from the conductive material 94 (i.e. the region of conductive material 94 laterally interposed between the upper surface of dielectric spacer 88). In addition, conductive material 94 may be deposited above dielectric spacer 88. In general, conductive material 94 may be deposited to a thickness in accordance with the design specifications for a bit line patterned therefrom. In particular, conductive material 94 may be deposited to a thickness above via 92 between approximately 7000 angstroms and approximately 10,000 angstroms. In general, conductive material 94 may include doped polysilicon or any metal material, such as aluminum, cobalt, copper, iron, nickel, nickel-iron-chromium, platinum, tantalum, titanium, tungsten, or a metal alloy thereof. In general, the deposition techniques may include those known in the microelectronic fabrication industry for the deposition of conductive materials, including but not limited to chemical vapor deposition and physical vapor deposition. In cases in which conductive material 94 includes aluminum, the material may preferably be deposited at a temperature less than approximately 300° C., a process sometimes referred to as a cold aluminum deposition. In this manner, the magnetic properties of the magnetic layers within magnetic cell junction may not be adversely altered.

Figure 18:
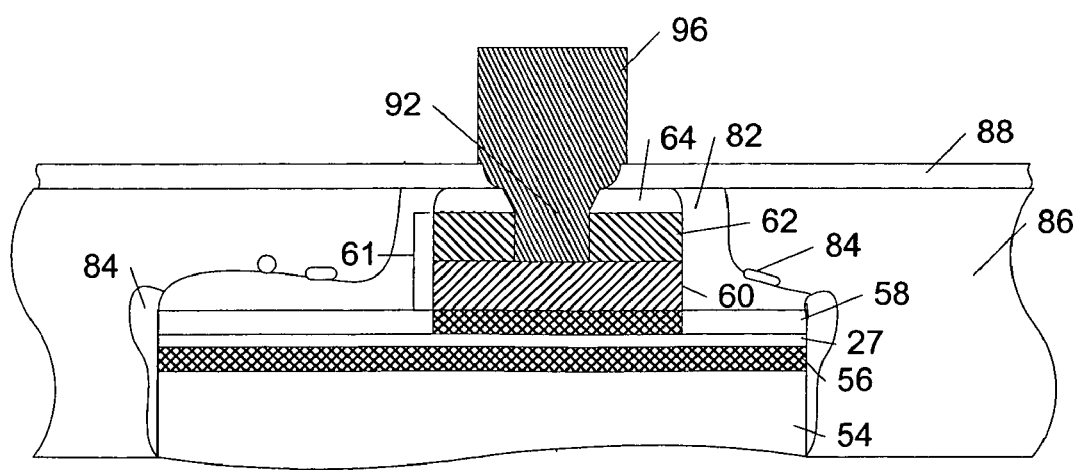
FIG. 18 depicts a cross-sectional view of the topography in which the conductive material is patterned subsequent to its deposition in FIG. 17.

Turning to FIG. 18, conductive material 94 may be patterned above dielectric spacer 88 to form bit line 96 extending from the upper surface of via 92. The etch process may include wet or dry etch techniques. For example, in embodiments in which conductive material includes aluminum, chlorine-based etch chemistries may be used, to offer a sufficient selectivity to the material of dielectric spacer 88 such that underlying portions of the magnetic cell junction are not exposed. Exemplary chlorine-based chemistries may include but are not limited to chlorine ($Cl_2$) and/or boron trichloride ($BCl_3$).

It will be appreciated to those skilled in the art having the benefit of this disclosure that this invention is believed to provide methods for patterning a magnetic cell junction and a structure used for and resulting from such methods. Further modifications and alternative embodiments of various aspects of the invention will be apparent to those skilled in the art in view of this description. For example, although the methods described herein are primarily discussed relative to the formation of a MRAM magnetic cell junction, the methods may be employed for any microelectronic technology including magnetic cell junctions. It is intended that the following claims be interpreted to embrace all such modifications and changes and, accordingly, the drawings and the specification are to be regarded in an illustrative rather than a restrictive sense.

What is claimed is:

1. A method for processing a topography for the formation of a microelectronic device, comprising:
    patterning a photoresist layer arranged upon the topography;
    etching portions of the topography adjacent to the patterned photoresist layer;
    terminating the step of etching the portions of the topography adjacent to the patterned photoresist layer within a cap film of the topography;
    removing a first set of etch residues from exposed portions of the cap film subsequent to the step of terminating;
    etching the topography to expose an uppermost magnetic layer of the topography subsequent to the step of removing the first set of etch residues; and
    exposing the topography to a plasma mainly comprising hydrogen to remove a second set of etch residues from exposed portions of the uppermost magnetic layer.

2. The method of claim 1, wherein the step of terminating the step of etching comprises terminating the step of etching within an upper layer of the cap film.

3. The method of claim 1, wherein the step of terminating the step of etching comprises terminating the step of etching at an interface between an upper layer and a lower layer of the cap film.

4. The method of claim 1, wherein the step of terminating the step of etching comprises terminating the step of etching within a lower layer of the cap film.

5. The method of claim 1, wherein the step of etching portions of the topography adjacent to the patterned photoresist layer comprises etching portions of a hardmask layer arranged above the cap film.

6. The method of claim 1, further comprising etching a majority of the patterned photoresist layer during the step of etching the portions of the topography adjacent to the patterned photoresist layer.

7. The method of claim 1, further comprising:
oxidizing exposed portions of the uppermost magnetic layer subsequent to the step of exposing the topography to the plasma mainly comprising hydrogen;
patterning a hardmask layer upon the oxidized exposed portions; and
ion milling portions of the oxidized exposed portions and one or more underlying layers in alignment with the patterned hardmask layer.

8. A method for processing a topography for the formation of a microelectronic device, comprising:
patterning a first mask layer over a stack of layers comprising at least two magnetic layers spaced apart by a tunneling layer;
etching a first portion of the stack of layers in alignment with the patterned first mask layer to form a first patterned portion of the stack of layers;
patterning a second dielectric mask layer above the first patterned portion;
ion milling a second portion of the stack of layers in alignment with the patterned second dielectric mask layer to form a second patterned portion of the stack of layers;
depositing a dielectric layer above the first and second patterned portions;
polishing the dielectric layer to a level above the second dielectric mask layer; and
ion milling the dielectric layer, a portion of the second dielectric mask layer, and a portion of the first mask layer to a level above a magnetic layer of the first patterned portion.

9. The method of claim 8, further comprising removing a photoresist layer used to pattern the second dielectric mask layer prior to the step of ion milling the second portion of the stack of layers.

10. The method of claim 1, wherein the step of exposing the topography to the plasma comprises exposing the topography to a plasma comprising a concentration having less than approximately 5% of oxygen atoms.

11. The method of claim 8, wherein the step of etching the first portion of the stack of layers comprises etching a conductive cap film arranged above an uppermost magnetic layer of the at least two magnetic layers.

12. The method of claim 11, wherein the step of etching the first portion of the stack of layers further comprises etching a hardmask layer arranged above the conductive cap film.

13. The method of claim 11, further comprising:
terminating the step of etching the first portion of the stack of layers within the conductive cap film;
removing etch residue from exposed portions of the conductive cap film subsequent to the step of terminating; and
etching remaining exposed portions of the conductive cap film to expose a first magnetic layer overlying the tunneling layer prior to the step of patterning the second dielectric mask layer.

14. The method of claim 13, wherein the first mask layer comprises a photoresist layer and wherein the method further comprises removing the photoresist layer prior to etching remaining exposed portions of the conductive cap film to expose the first magnetic layer.

15. The method of claim 13, further comprising oxidizing exposed portions of the first magnetic layer prior to the step of patterning the second dielectric mask layer, wherein the step of ion milling the second portion of the stack of layers comprises ion milling regions of the oxidized portions, regions of the tunneling layer, and regions of a second magnetic layer underlying the tunneling layer.

16. The method of claim 15, further comprising exposing the topography to a plasma mainly comprising hydrogen to remove etch residues from exposed portions of the first magnetic layer prior to the step of oxidizing the exposed portions of the first magnetic layer.

17. A method for processing a topography for the formation of a microelectronic device, comprising:
patterning a first mask layer over a stack of layers comprising at least two magnetic layers spaced apart by a tunneling layer;
etching a first portion of the stack of layers in alignment with the patterned first mask layer to form a first patterned portion of the stack of layers;
patterning a second dielectric mask layer above the first patterned portion;
ion milling a second portion of the stack of layers in alignment with the patterned second dielectric mask layer to form a second patterned portion of the stack of layers;
depositing a dielectric layer above the first and second patterned portions;
polishing the dielectric layer to a level above the second dielectric mask layer; and
ion milling the dielectric layer and a portion of the second dielectric mask layer to a level above a magnetic layer of the first patterned portion.

18. The method of claim 17, further comprising removing a photoresist layer used to pattern the second dielectric mask layer prior to the step of ion milling the second portion of the stack of layers.

* * * * *